United States Patent
Lin et al.

(10) Patent No.: US 9,997,442 B1
(45) Date of Patent: Jun. 12, 2018

(54) SEMICONDUCTOR DEVICE AND METHOD OF MANUFACTURING THE SAME

(71) Applicant: Advanced Semiconductor Engineering, Inc., Kaohsiung (TW)

(72) Inventors: Chai-Chi Lin, Kaohsiung (TW); Chih-Cheng Lee, Kaohsiung (TW); Hsing Kuo Tien, Kaohsiung (TW); Chih-Yung Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/379,362

(22) Filed: Dec. 14, 2016

(51) Int. Cl.
| *H01L 23/498* | (2006.01) |
| *H01L 23/538* | (2006.01) |
| *H01L 21/48*  | (2006.01) |
| *H01L 25/18*  | (2006.01) |
| *H01L 25/16*  | (2006.01) |
| *H01L 25/065* | (2006.01) |

(52) U.S. Cl.
CPC ...... *H01L 23/49822* (2013.01); *H01L 21/481* (2013.01); *H01L 21/486* (2013.01); *H01L 21/4857* (2013.01); *H01L 23/49827* (2013.01); *H01L 23/49838* (2013.01); *H01L 23/5383* (2013.01); *H01L 23/5384* (2013.01); *H01L 23/5386* (2013.01); *H01L 25/0655* (2013.01); *H01L 25/16* (2013.01); *H01L 25/18* (2013.01)

(58) Field of Classification Search
CPC . H01L 21/481; H01L 21/4857; H01L 21/486; H01L 23/49822; H01L 23/49827; H01L 23/49838; H01L 23/5383; H01L 23/5384; H01L 23/5386; H01L 25/16; H01L 25/18; H01L 25/0655
See application file for complete search history.

(56) References Cited

U.S. PATENT DOCUMENTS

| 6,090,468 A   * | 7/2000 | Shimada ........... H01L 21/4857 156/300 |
| 6,674,159 B1 * | 1/2004 | Peterson .............. B81B 7/0067 257/431 |
| 6,797,367 B2 * | 9/2004 | Ogawa ................ H05K 1/0353 174/258 |
| 7,498,205 B2   | 3/2009 | Jung et al. |
| 7,535,094 B2 * | 5/2009 | Tornqvist .......... H01L 25/0652 257/685 |
| 8,388,792 B2   | 3/2013 | Weidinger et al. |
| 8,450,616 B2   | 5/2013 | Chang |
| 8,500,938 B2   | 8/2013 | Stahr et al. |
| 8,541,689 B2   | 9/2013 | Weidinger et al. |
| 8,685,196 B2   | 4/2014 | Weichslberger et al. |
| 2006/0054351 A1* | 3/2006 | Tornqvist .......... H01L 25/0652 174/256 |
| 2008/0049405 A1* | 2/2008 | Sahara .................. H05K 1/183 361/761 |

(Continued)

*Primary Examiner* — Christine Enad
(74) *Attorney, Agent, or Firm* — Foley & Lardner LLP; Cliff Z. Liu

(57) ABSTRACT

A semiconductor substrate includes an interconnection structure and a dielectric layer. The dielectric layer surrounds the interconnection structure and defines a first cavity. The first cavity is defined by a first sidewall, a second sidewall, and a first surface of the dielectric layer. The first sidewall is laterally displaced from the second sidewall.

27 Claims, 46 Drawing Sheets

(56) References Cited

U.S. PATENT DOCUMENTS

| | | | |
|---|---|---|---|
| 2010/0147560 A1* | 6/2010 | Kaneko | H01L 23/13 174/250 |
| 2011/0042124 A1* | 2/2011 | Matsui | H05K 1/0274 174/157 |
| 2013/0271924 A1* | 10/2013 | Shen | H05K 1/181 361/728 |
| 2013/0276969 A1 | 10/2013 | Chang | |
| 2014/0138130 A1 | 5/2014 | Chang et al. | |
| 2014/0216795 A1 | 8/2014 | Weichslberger et al. | |
| 2015/0007934 A1 | 1/2015 | Gotzinger et al. | |
| 2016/0037645 A1 | 2/2016 | Lee et al. | |
| 2016/0037646 A1 | 2/2016 | Lee et al. | |

\* cited by examiner

US 9,997,442 B1

SEMICONDUCTOR DEVICE AND METHOD OF MANUFACTURING THE SAME

BACKGROUND

1. Technical Field

The present disclosure relates to a semiconductor device and a method of manufacturing the same, and more particularly to a semiconductor substrate with a cavity therein and a manufacturing method thereof.

2. Description of the Related Art

Semiconductor devices have become progressively more complex, driven at least in part by the demand for enhanced processing speeds and smaller sizes. To reduce the total size of a semiconductor device, a portion of electronic components can be embedded into a substrate, which would increase a capability of embedded semiconductor package devices. Therefore, it is desirable to develop a semiconductor substrate with at least one cavity to accommodate electronic components or chips of semiconductor devices.

In some approaches, a release layer is disposed at a location within a substrate where a cavity would be formed, and then the release layer and parts of the substrate above the release layer are removed to form a cavity, However, when mechanical or laser drilling is carried out to form the cavity, a bottom surface of the cavity may be uneven due to a deviation of the drilling process. Such uneven bottom surface might affect the performance of an electronic component or a chip disposed therein. In addition, the use of an additional material (such as the release layer) may adversely affect subsequent processes.

SUMMARY

In accordance with some embodiments of the present disclosure, a semiconductor substrate comprises an interconnection structure and a dielectric layer. The dielectric layer surrounds the interconnection structure and defines a first cavity. The first cavity is defined by a first sidewall, a second sidewall, and a first surface of the dielectric layer. The first sidewall is laterally displaced from the second sidewall.

In accordance with some embodiments of the present disclosure, a substrate comprises a dielectric layer and an interconnection structure. The dielectric layer defines a first cavity extending from a top surface of the dielectric layer and a second cavity disposed under the first cavity. The first cavity and the second cavity expose a portion of the interconnection structure, and a width of the first cavity is different from a width of the second cavity.

In accordance with some embodiments of the present disclosure, a substrate comprises a core structure, a first conductive layer, a second conductive, a first dielectric layer, and a second dielectric layer. The core structure has a top surface and a bottom surface opposite to the top surface. The first conductive layer is on the top surface of the core structure. The second conductive layer is on the bottom surface of the core structure. The first dielectric layer is on the top surface of the core structure. The second dielectric layer is on the bottom surface of the core structure. The first dielectric layer defines a first cavity extending from a top surface of the first dielectric layer toward the top surface of the core structure. The first cavity exposes a portion of the first conductive layer. The first cavity is defined by a first sidewall and a second sidewall of the first dielectric layer, and the first sidewall is laterally displaced from the second sidewall.

Figure 1:
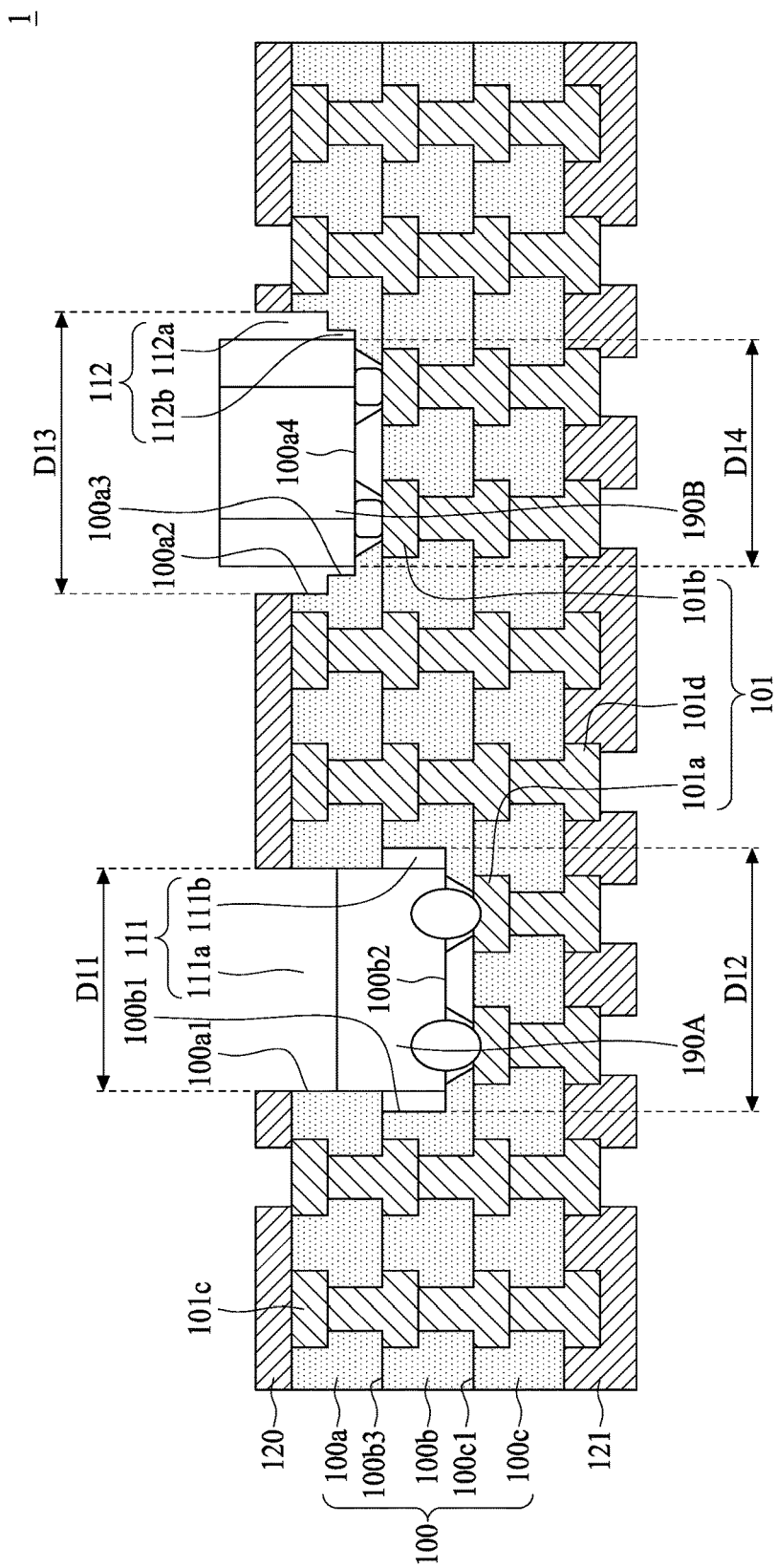
FIG. 1 illustrates a cross-sectional view of a semiconductor substrate in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1 illustrates a cross-sectional view of a semiconductor substrate 1 in accordance with some embodiments of the present disclosure. The semiconductor substrate 1 comprises a multi-layered dielectric layer 100, interconnection structures 101, cavities 111, 112, protective layers 120, 121 and electronic components 190A, 190B.

The multi-layered dielectric layer 100 comprises a plurality of dielectric layers (or sub-layers) 100a, 100b and 100c. Each of the dielectric layers 100a, 100b and 100c may include a material such as polypropylene (PP), bismaleimide-triazine (BT) resin, epoxy, polyimide (PI) or other dielectric materials. Each of the dielectric layers 100a, 100b and 100c may have a thickness from approximately 5 μm to approximately 30 μm. The dielectric layers 100a, 100b and 100c may include a same material or may include different materials.

The cavity 111 is defined by a sidewall 100a1 of the dielectric layer 100a and a sidewall 100b1 and a surface (e.g., a top surface) 100b2 of the dielectric layer 100b. The sidewall 100a1 of the dielectric layer 100a is not coplanar with the sidewall 100b1 of the dielectric layer 100b. The sidewall 100a1 of the dielectric layer 100a and the sidewall 100b1 of the dielectric layer 100b are discontinuous and are laterally displaced from one another. A width D11 of the sidewall 100a1 is smaller than a width D12 of the sidewall 100b1. For example, the width D11 may be less than approximately 90% or less than approximately 85% of the width D12.

The cavity 111 comprises two sub-cavities 111a, 111b. The sub-cavity 111a is surrounded by the sidewall 100a1 and the sub-cavity 111b is surrounded by the sidewall 100b1. The sub-cavity 111a is over the sub-cavity 111b. The width D11 of the sub-cavity 111a is smaller than the width D12 of the sub-cavity 111b. The sidewall shape of cavity 111 is ledge-like, and thus the electronic component 190A (e.g., a chip or a passive component) accommodated therein can be firmly fixed.

In some embodiments of the present disclosure, the semiconductor substrate 1 may comprise more or less dielectric layers than three. In some embodiments of the present disclosure, the semiconductor substrate 1 may comprise a dielectric layer which is a single-layered monolithic structure. As shown in FIG. 1, the cavity 111 is formed into two dielectric layers 100a, 100b. In some embodiments, the cavity 111 can be formed into M dielectric layers (where M is a positive integer that is 2 or different than 2, for example, M could be more or less than 2), depending on the design specification.

The cavity 112 is defined by sidewalls 100a2 and 100a3 and a surface (e.g., a top surface) 100a4 of the dielectric layer 100a. The sidewall 100a2 of the dielectric layer 100a is not coplanar with the sidewall 100a3 of the dielectric layer 100a. The sidewall 100a2 of the dielectric layer 100a and the sidewall 100a3 of the dielectric layer 100a are discontinuous and are laterally displaced from one another. A width D13 of the sidewall 100a2 is greater than a width D14 of the sidewall 100a3. For example, the width D13 may be greater than approximately 110% or greater than approximately 115% of the width D14.

The cavity 112 comprises two sub-cavities 112a, 112b. The sub-cavity 112a is surrounded by the sidewall 100a2 and the sub-cavity 112b is surrounded by the sidewall 100a3. The sub-cavity 112a is over the sub-cavity 112b. The width D13 of the sub-cavity 112a is greater than the width D14 of the sub-cavity 112b. The sidewall shape of cavity 112 is ladder-like, to facilitate placement of the electronic component 190B (e.g., a chip or a passive component) into the cavity 112.

As shown in FIG. 1, the cavity 112 is formed into the dielectric layer 100a. In some embodiments of the present disclosure, the cavity 112 can be formed into N dielectric layers (where N is a positive integer that is 1 or different than 1, for example, N could be more than 1), depending on the design specification. Therefore, the depicted embodiments provide greater ease and flexibility in designing the depths of the cavity 111 or 112. In addition, by forming the cavities 111, 112 into the dielectric layer 100 as shown in FIG. 1 to accommodate the electronic components 190A and 190B, the height of a package device can be effectively reduced, which would in turn to reduce the total volume of the package device.

The interconnection structures 101 are disposed within the semiconductor substrate 1. The interconnection structures 101 include, for example, conductive patterned layers that may include conductive pads, vias and traces. The interconnection structures 101 comprise conductive pads 101a, 101b. A top surface of the conductive pad 101a is substantially coplanar with a top surface 100c1 of the dielectric layer 100c. A portion of the top surface of the conductive pad 101a is covered by and another portion thereof is exposed from the dielectric layer 100b. A top surface of the conductive pad 101b is substantially coplanar with a top surface 100b3 of the dielectric layer 100b. A portion of the top surface of the conductive pad 101b is covered by and another portion thereof is exposed from the dielectric layer 100a. In some embodiments, the exposed portions of the conductive pads 101a, 101b are used to provide electrical connections between the interconnection structures 101 and the electronic components 190A and 190B accommodated within the cavities 111, 112 respectively. The conductive pads 101a, 101b may include, but are not limited to, copper (Cu) or another metal or alloy.

The electronic components 190A, 190B are disposed within the cavities 111, 112, respectively. In some embodiments, the electronic components 190A, 190B are electrically connected to the conductive pads 101a, 101b by way of flip-chip bonding. The electronic component 190A or 190B may be an active component, such as an integrated circuit (IC) chip or a die. Alternatively, the electronic component 190A or 190B may be a passive electrical component, such as a capacitor, a resistor or an inductor. The electronic components 190A, 190B may be electrically connected to each other or to other electronic components through the interconnection structures 101.

The protective layer 120 is disposed on the dielectric layer 100a. The protective layer 120 covers the dielectric layer 100a and exposes portions of conductive pads 101c. The protective layer 121 is disposed under the dielectric layer 100c. The protective layer 121 covers the dielectric layer 100c and exposes portions of conductive pads 101d. In some embodiments, the protective layers 120, 121 may include solder resists.

Figure 2:
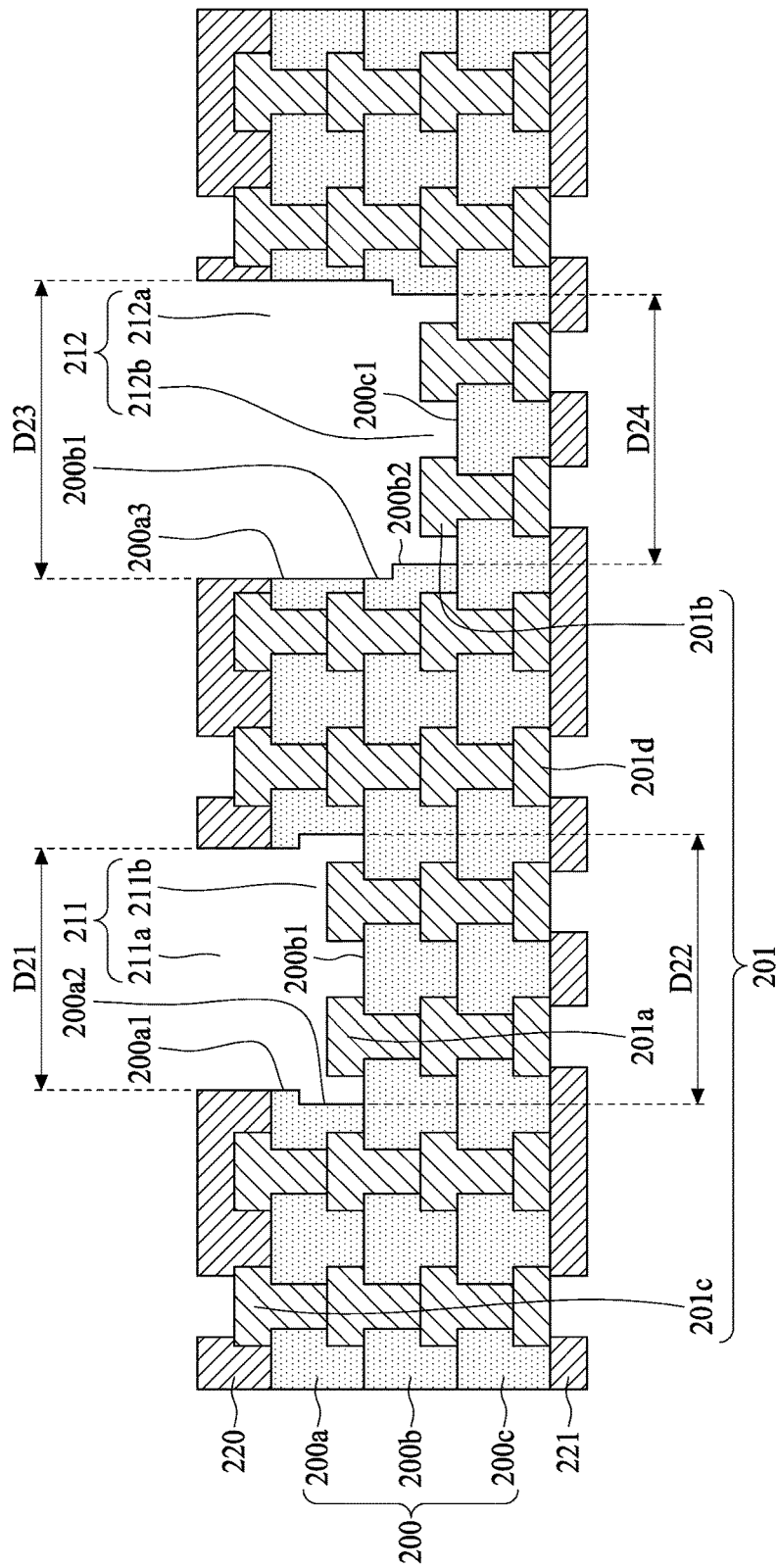
FIG. 2 illustrates a cross-sectional view of a semiconductor substrate in accordance with some embodiments of the present disclosure.

FIG. 2 illustrates a cross-sectional view of a semiconductor substrate 2 in accordance with some embodiments of the present disclosure. The semiconductor substrate 2 comprises a multi-layered dielectric layer 200, interconnection structures 201, cavities 211, 212 and protective layers 220, 221.

The multi-layered dielectric layer 200 comprises a plurality of dielectric layers (or sub-layers) 200a, 200b and 200c. Each of the dielectric layers 200a, 200b and 200c may include a material such as PP, BT, epoxy, PI, or other dielectric materials. Each of the dielectric layers 200a, 200b and 200c may have a thickness from approximately 5 μm to approximately 30 μm. The dielectric layers 200a, 200b and 200c may include a same material or may include different materials.

The cavity 211 is defined by sidewalls 200a1 and 200a2 of the dielectric layer 200a and a surface (e.g., a top surface) 200b1 of the dielectric layer 200b. The sidewall 200a1 is not coplanar with the sidewall 200a2. In other words, the sidewall 200a1 and the sidewall 200a2 are discontinuous and are laterally displaced from one another. A width D21 of the sidewall 200a1 is smaller than a width D22 of the sidewall 200a2. For example, the width D21 may be less than approximately 90% or less than approximately 85% of the width D22.

The cavity 211 comprises two sub-cavities 211a, 211b. The sub-cavity 211a is surrounded by the sidewall 200a1 and the sub-cavity 211b is surrounded by the sidewall 200a2. The sub-cavity 211a is over the sub-cavity 211b. The width D21 of the sub-cavity 211a is smaller than the width D22 of the sub-cavity 211b.

In some embodiments of the present disclosure, the semiconductor substrate 2 may comprise more or less dielectric layers than three. In some embodiments of the present disclosure, the semiconductor substrate 2 may comprise a dielectric layer as a single-layered monolithic structure. As shown in FIG. 2, the cavity 211 is formed into the single dielectric layer 200a. In some embodiments, the cavity 211 can be formed into M dielectric layers (where M is a positive integer that is 1 or different than 1, for example, M could be more than 1), depending on the design specification.

The cavity 212 is defined by sidewall 200a3 of the dielectric layer 200a, sidewalls 200b1, 200b2 of the dielectric layer 200b and a surface (e.g., a top surface) 200c1 of the dielectric layer 200c. The sidewall 200a3 is coplanar or substantially coplanar with the sidewall 200b1. The sidewall 200b1 is not coplanar with the sidewall 200b2. In other words, the sidewall 200b1 and the sidewall 200b2 are discontinuous and are laterally displaced from one another. A width D23 of the sidewall 200b1 is greater than a width D24 of the sidewall 200b2. For example, the width D23 may be greater than approximately 110% or greater than approximately 115% of the width D24.

The cavity 212 comprises two sub-cavities 212a, 212b. The sub-cavity 212a is surrounded by the sidewalls 200a3 and 200b1, and the sub-cavity 212b is surrounded by the sidewall 200b2. The sub-cavity 212a is over the sub-cavity 212b. The width D23 of the sub-cavity 212a is greater than the width D24 of the sub-cavity 212b.

As shown in FIG. 2, the cavity 212 is formed into two dielectric layers 200a and 200b. In some embodiments of the present disclosure, the cavity 212 can be formed into N dielectric layers (where N is a positive integer that is 2 or different than 2, for example, N could be less or more than 2), depending on the design specification.

The interconnection structures 201 are disposed within the semiconductor substrate 2. The interconnection structures 201 include, for example, conductive patterned layers that may include conductive pads, vias and traces. The interconnection structures 201 comprise conductive pads 201a, 201b. The conductive pad 201a is disposed on the top surface 200b1 of the dielectric layer 200b and within the space defined by the cavity 211. The conductive pad 201b is disposed on the top surface 200c1 of the dielectric layer 200c. In some embodiments, the conductive pads 201a, 201b are used to provide electrical connections between the interconnection structures 201 and electronic components accommodated within the cavities 211, 212 respectively. The conductive pads 201a, 201b may include, but are not limited to, Cu or another metal or alloy. In some embodiments, a thickness of each of the conductive pads 201a, 201b is less than a thickness of any of the dielectric layers 200a, 200b, 200c. In some embodiments, a top surface of the conductive pad 201a may be coplanar with the top surface 200b1 of the dielectric layer 200b. In some embodiments, a top surface of the conductive pad 201b may be coplanar with the top surface 200c1 of the dielectric layer 200c.

The protective layer 220 is disposed on the dielectric layer 200a. The protective layer 220 covers the dielectric layer 200a and exposes portions of conductive pads 201c. The protective layer 221 is disposed under the dielectric layer 200c. The protective layer 221 covers the dielectric layer 200c and exposes portions of conductive pads 201d. In some embodiments, the protective layers 220, 221 may include solder resists.

Figure 3:
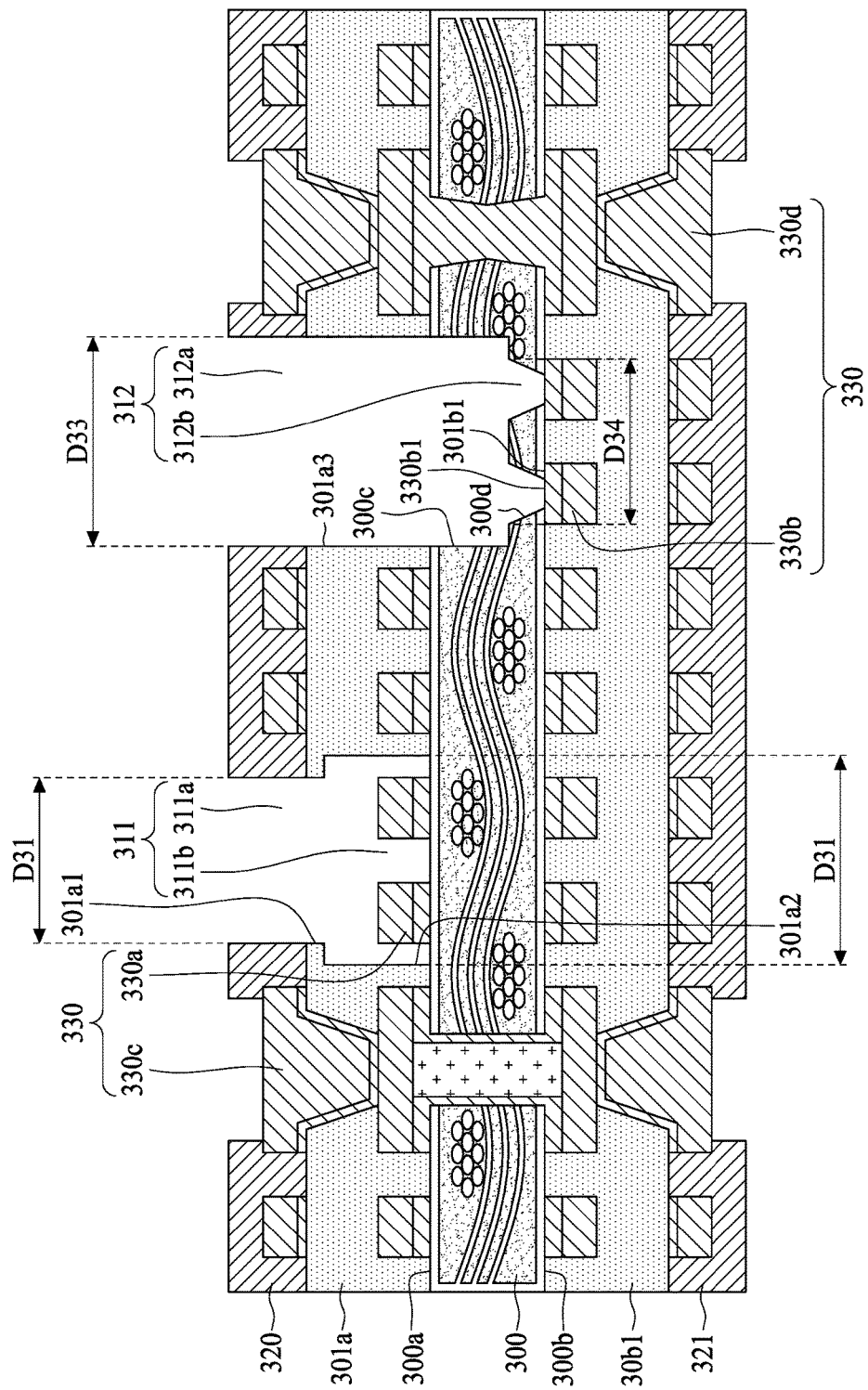
FIG. 3 illustrates a cross-sectional view of a semiconductor substrate in accordance with some embodiments of the present disclosure.

FIG. 3 illustrates a cross-sectional view of a semiconductor substrate 3 in accordance with some embodiments of the present disclosure. The semiconductor substrate 3 comprises a core structure 300, dielectric layers 301a, 301b, interconnection structures 330, cavities 311, 312 and protective layers 320, 321.

The core structure 300 has a top surface 300a and a bottom surface 300b opposite to the top surface 300a. The core structure 300 may be, for example, selected from, but is not limited to, a silicon substrate, a plastic substrate, or a ceramic substrate.

The dielectric layer 301a is disposed on the top surface 300a of the core structure 300. The dielectric layer 301b is disposed on the bottom surface 300b of the core structure 300. Each of the dielectric layers 301a, 301b may include a material such as PP, BT, epoxy, PI or other dielectric materials. Each of the dielectric layers 301a, 301b may have a thickness from approximately 5 µm to approximately 30 µm. The dielectric layers 301a, 301b may include a same material or may include different materials.

The cavity 311 is defined by sidewalls 301a1 and 301a2 of the dielectric layer 301a and the top surface 300a of the core structure 300. The sidewall 301a1 is not coplanar with the sidewall 301a2. In other words, the sidewall 301a1 and the sidewall 301a2 are discontinuous and are laterally displaced from one another. A width D31 of the sidewall 301a1 is smaller than a width D32 of the sidewall 301a2. For example, the width D31 may be less than approximately 90% or less than approximately 85% of the width D32.

The cavity 311 comprises two sub-cavities 311a, 311b. The sub-cavity 311a is surrounded by the sidewall 301a1 and the sub-cavity 311b is surrounded by the sidewall 301a2. The sub-cavity 311a is over the sub-cavity 311b. The width D31 of the sub-cavity 311a is smaller than the width D32 of the sub-cavity 311b.

In some embodiments of the present disclosure, the semiconductor substrate 3 may comprise more or less dielectric layers than two. As shown in FIG. 3, the cavity 311 is formed into the single dielectric layer 301a. In some embodiments, the cavity 311 can be formed into M dielectric layers (where M is a positive integer that is 1 or different than 1, for example, M could be more than 1), depending on the design specification.

The cavity 312 is defined by a sidewall 301a3 of the dielectric layer 301a, sidewalls 300c and 300d of the core structure 300 and a surface (e.g., a top surface) 301b1 of the dielectric layer 301b. The sidewall 301a3 is coplanar or substantially coplanar with the sidewall 300c. The sidewall 300c is not coplanar with the sidewall 300d. In other words, the sidewall 300c and the sidewall 300d are discontinuous and are laterally displaced from one another. A width D33 of the sidewall 300c is greater than a width D34 of the sidewall 300d. For example, the width D33 may be greater than approximately 110% or greater than approximately 115% of the width D34.

The cavity 312 comprises two sub-cavities 312a, 312b. The sub-cavity 312b is surrounded by the sidewall 300d, and the sub-cavity 312a is surrounded by the sidewalls 301a3 and 300c. The sub-cavity 312a is over the sub-cavity 312b. The width D33 of the sub-cavity 312a is greater than the width D34 of the sub-cavity 312b.

The interconnection structures 330 are disposed within the semiconductor substrate 3. The interconnection structures 301 include, for example, conductive patterned layers that may include conductive pads, vias and traces. The interconnection structures 330 comprise conductive pads 330a, 330b. The conductive pad 330a is disposed on the top surface 300a of the core structure 300. A top surface 330b1 of the conductive pad 330b is substantially coplanar with the top surface 301b1 of the dielectric layer 301b. A portion of the top surface 330b1 of the conductive pad 330b is covered by and another portion thereof is exposed from the core structure 300. In some embodiments, the conductive pads 330a, 330b are used to provide electrical connections between the interconnection structures 330 and electronic components accommodated within the cavities 311, 312, respectively. The conductive pads 330a, 330b may include, but are not limited to, Cu or another metal or alloy. In some embodiments, a thickness of each of the conductive pads 330a, 330b is less than a thickness of any of the dielectric layers 301a, 301b.

The protective layer 320 is disposed on the dielectric layer 301a. The protective layer 320 covers the dielectric layer 301a and exposes portions of conductive pads 330c. The protective layer 321 is disposed under the dielectric layer 301b. The protective layer 321 covers the dielectric layer 301b and exposes portions of conductive pads 330d. In some embodiments, the protective layers 320, 321 may include solder resists.

Figure 4:
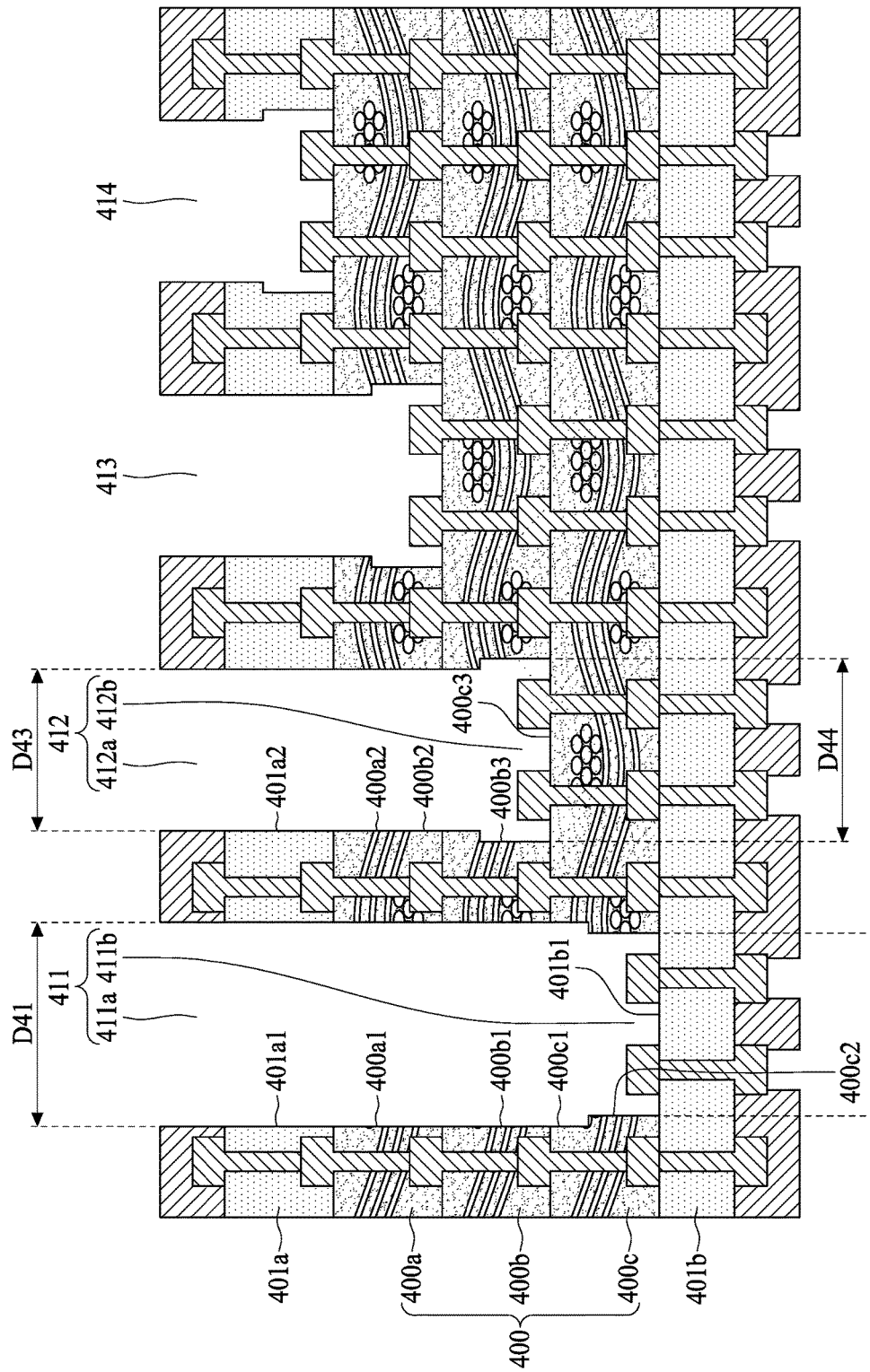
FIG. 4 illustrates a cross-sectional view of a semiconductor substrate in accordance with some embodiments of the present disclosure.

FIG. 4 illustrates a cross-sectional view of a semiconductor substrate 4 in accordance with some embodiments of the present disclosure. The semiconductor substrate 4 is similar in some respects to the semiconductor substrate 3 in FIG. 3 except that the semiconductor substrate 4 comprises a 3-layer core structure 400 including core structures (or sub-structures) 400a, 400b and 400c.

A cavity 411 is defined by a sidewall 401a1 of a dielectric layer 401a, a sidewall 400a1 of the core structure 400a, a sidewall 400b1 of the core structure 400b, sidewalls 400c1, 400c2 of the core structure 400c and a top surface 401b1 of a dielectric layer 401b. The sidewall 400c1 is not coplanar with the sidewall 400c2. In other words, the sidewall 400c1 and the sidewall 400c2 are discontinuous and are laterally displaced from one another. A width D41 of the sidewall 400c1 is greater than a width D42 of the sidewall 400c2. For example, the width D41 may be greater than approximately 110% or greater than approximately 115% of the width D42.

The cavity 411 comprises two sub-cavities 411a, 411b. The sub-cavity 411a is surrounded by the sidewalls 401a1, 400a1, 400b1 and 400c1, and the sub-cavity 411b is surrounded by the sidewall 400c2. The sub-cavity 411a is over the sub-cavity 411b. The width D41 of the sub-cavity 411a is greater than the width D42 of the sub-cavity 411b.

A cavity 412 is defined by a sidewall 401a2 of the dielectric layer 401a, a sidewall 400a2 of the core structure 400a, sidewalls 400b2, 400b3 of the core structure 400b and a top surface 400c3 of the core structure 400c. The sidewall 400b2 is not coplanar with the sidewall 400b3. In other words, the sidewall 400b2 and the sidewall 400b3 are discontinuous and are laterally displaced from one another. A width D43 of the sidewall 400b2 is less than a width D44 of the sidewall 400b3. For example, the width D43 may be less than approximately 90% or less than approximately 85% of the width D44.

The cavity 412 comprises two sub-cavities 412a, 412b. The sub-cavity 412a is surrounded by the sidewalls 401a2, 400a2 and 400b2, and the sub-cavity 412b is surrounded by the sidewall 400b3. The sub-cavity 412a is over the sub-cavity 412b. The width D43 of the sub-cavity 412a is less than the width D44 of the sub-cavity 412b.

A cavity 413 is similar to the cavity 412 except that the cavity 413 is formed in the dielectric layer 401a and the core structure 400a while the cavity 413 is formed in the dielectric layer 401a and the core structures 400a and 400b. The cavity 414 is similar to the cavity 411 except that the cavity 414 is formed in the dielectric layer 401a while the cavity 411 is formed in the dielectric layer 401a and the core structures 400a, 400b and 400c.

Figure 5A:
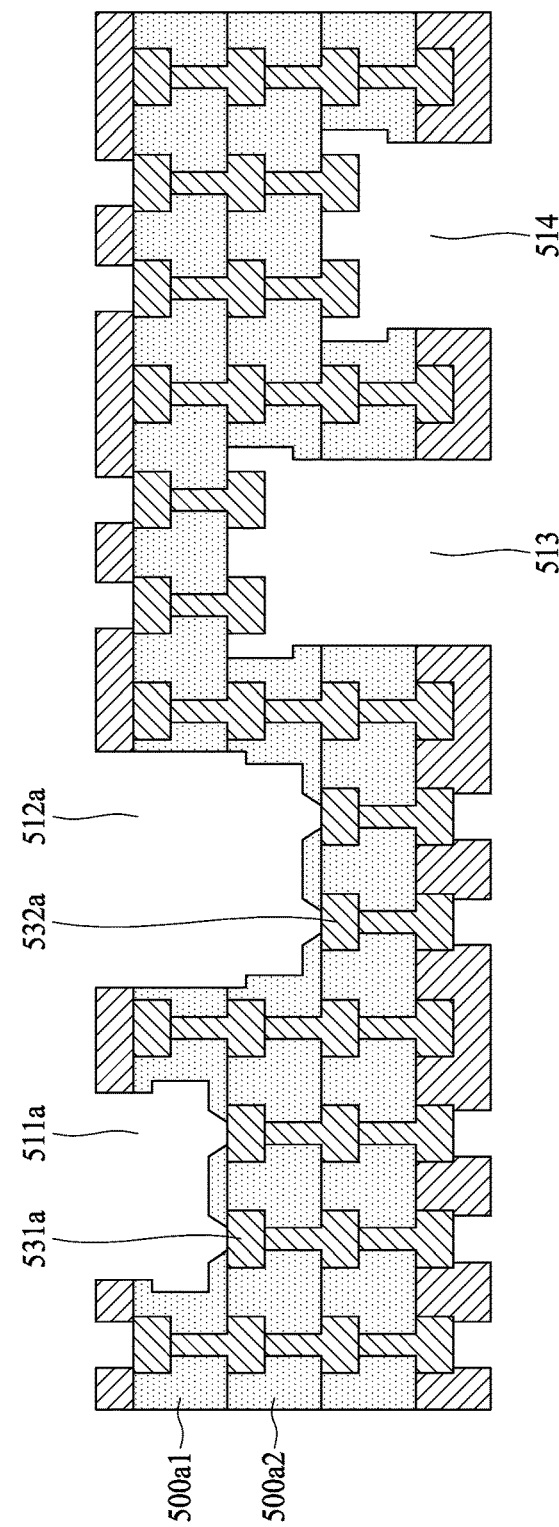
FIG. 5A illustrates a cross-sectional view of a semiconductor substrate in accordance with some embodiments of the present disclosure.

FIG. 5A illustrates a cross-sectional view of a semiconductor substrate 5A in accordance with some embodiments of the present disclosure. The semiconductor substrate 5A is similar in some respects to the semiconductor substrate 1 in FIG. 1 except that the semiconductor substrate 5A further comprises cavities 513 and 514.

The cavities 513 and 514 are similar to cavities 511a and 512a, except that the openings of the cavities 513 and 514 are opposite to the openings of the cavities 511a and 512a. For example, the openings of the cavities 511a and 512a are facing upward while the openings of the cavities 513 and 514 are facing downward. By forming cavities in different directions, greater flexibility and effectiveness in the design of the semiconductor substrate 5A can be attained.

Figure 5B:
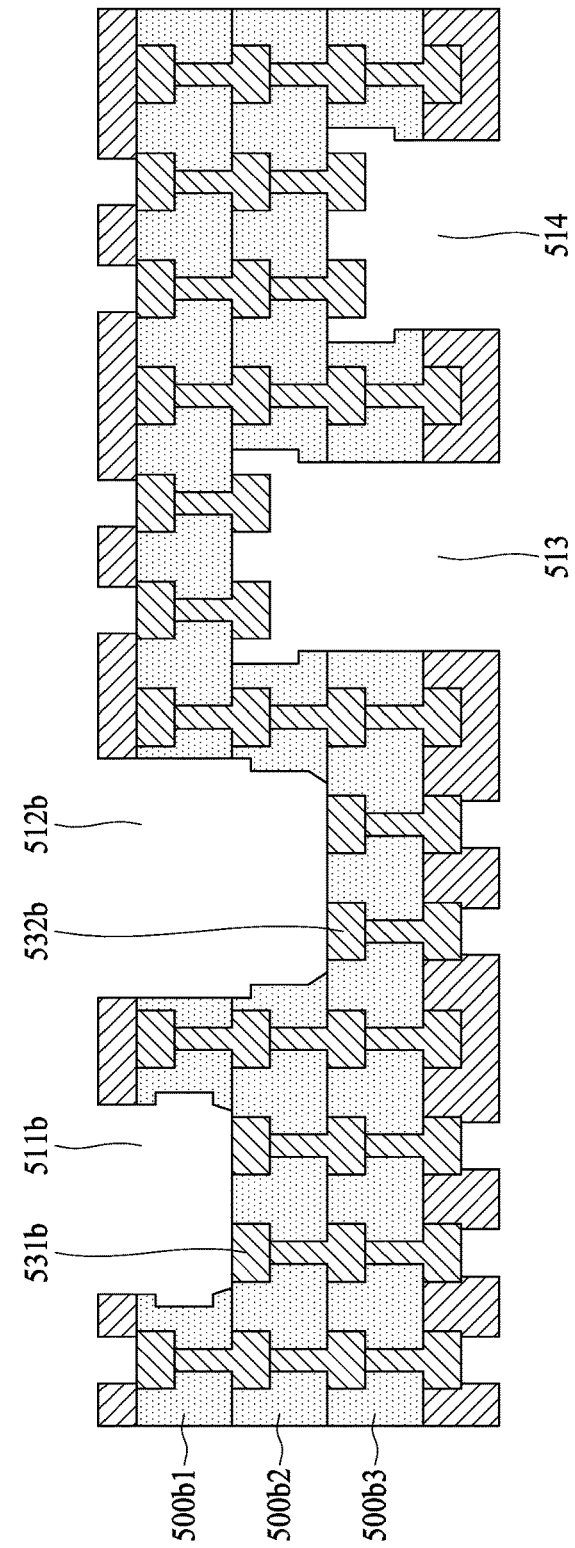
FIG. 5B illustrates a cross-sectional view of a semiconductor substrate in accordance with some embodiments of the present disclosure.

FIG. 5B illustrates a cross-sectional view of a semiconductor substrate 5B in accordance with some embodiments of the present disclosure. The semiconductor substrate 5B is similar to the semiconductor substrate 5A in FIG. 5A except that top surfaces of conductive pads 531b and 532b are not covered by dielectric layers 500b1, 500b2.

In FIG. 5A, a portion of a top surface of a conductive pad 531a is covered by a dielectric layer 500a1 and a portion of a top surface of a conductive pad 532a is covered by a dielectric layer 500a2. In FIG. 5B, the top surface of the conductive pad 531b is substantially completely exposed from the dielectric layer 500b1 and the top surface of the conductive pad 532b is substantially completely exposed from the dielectric layer 500b2. In other words, the top surface of the conductive pad 531b is substantially coplanar with a top surface of the dielectric layer 500b2 and the top surface of the conductive pad 532b is substantially coplanar with a top surface of the dielectric layer 500b3.

Figure 6:
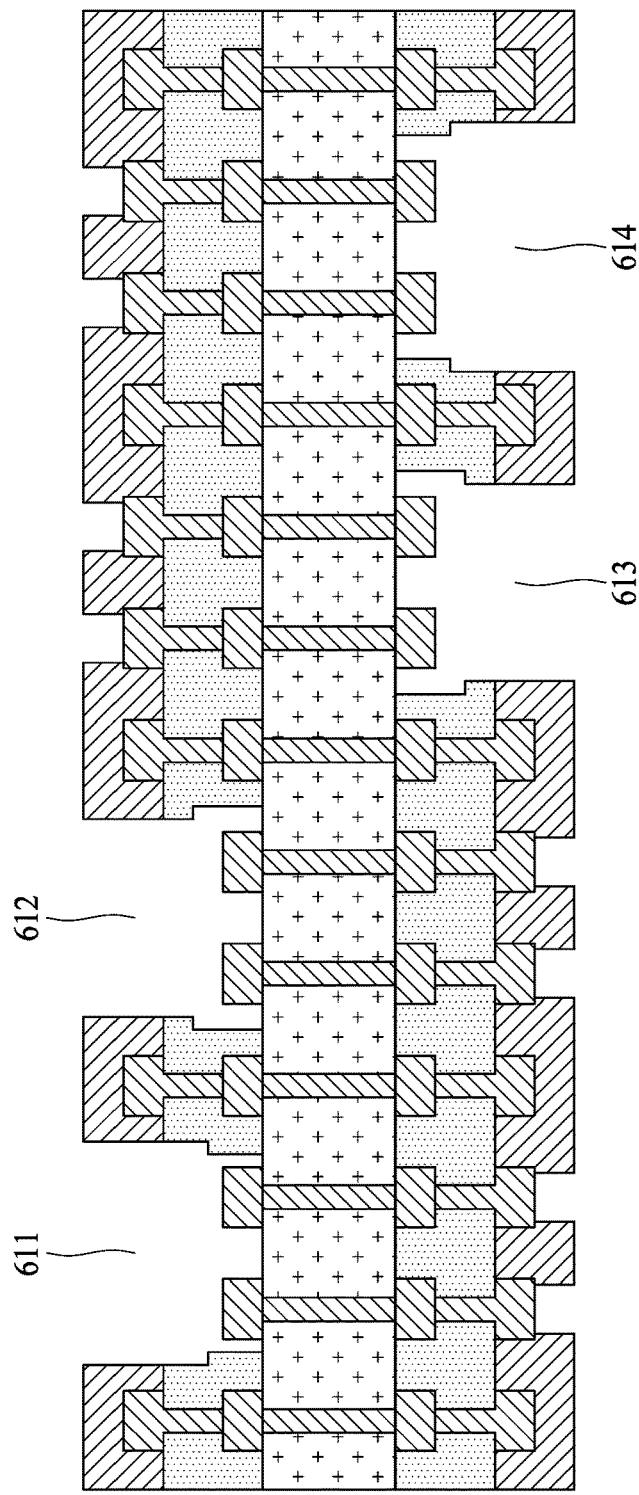
FIG. 6 illustrates a cross-sectional view of a semiconductor substrate in accordance with some embodiments of the present disclosure.

FIG. 6 illustrates a cross-sectional view of a semiconductor substrate 6 in accordance with some embodiments of the present disclosure. The semiconductor substrate 6 is similar in some respects to the semiconductor substrate 3 in FIG. 3 except that the semiconductor substrate 6 further comprises cavities 613 and 614.

The cavities 613 and 614 are similar to cavities 611 and 612, except that the openings of the cavities 613 and 614 are opposite to the openings of the cavities 611 and 612. For example, the openings of the cavities 611 and 612 are facing upward while the openings of the cavities 613 and 614 are facing downward. By forming the cavities in different directions, greater flexibility and effectiveness in the design of the semiconductor substrate 6 can be attained.

FIGS. 7A-7I illustrate a semiconductor manufacturing method in accordance with some embodiments of the present disclosure.

Figure 7A:
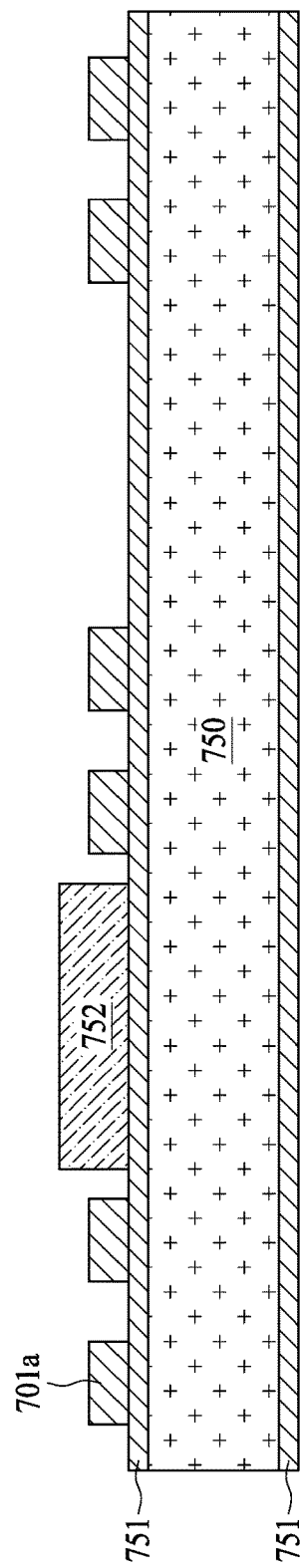
FIG. 7A, FIG. 7B, FIG. 7C, FIG. 7D, FIG. 7E, FIG. 7F, FIG. 7G, FIG. 7H, and FIG. 7I illustrate a manufacturing method in accordance with some embodiments of the present disclosure.

Referring to FIG. 7A, a carrier 750 is provided. The carrier 750 may be, for example, a silicon substrate, a plastic substrate or a metal panel. The carrier 750 may facilitate subsequent processes thereon.

A metal layer 751 is formed on a top surface and a bottom surface of the carrier 750. The metal layer 751 may be a thin sheet. In some embodiments, the metal layer 751 has a thickness of approximately 2 μm. In some embodiments, the metal layer 751 includes Cu or another conductive material.

A patterned conductive layer 701a is formed on the metal layer 751. The patterned conductive layer 701a may be formed, for example, using photo-lithography and plating technology. The patterned conductive layer 701a may include, but is not limited to, Cu or another metal or alloy.

A sacrificial layer 752 is formed on the metal layer 751. In some embodiments, the sacrificial layer 752 may be a dry film or formed of a coating film, peelable adhesive or other suitable materials.

Figure 7B:
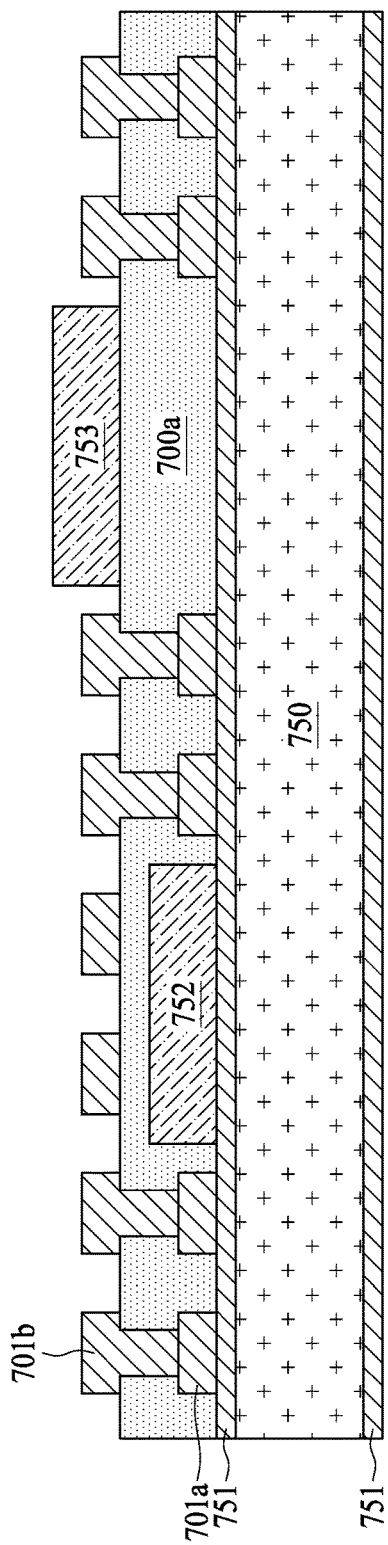

Referring FIG. 7B, a dielectric layer 700a is formed on the metal layer 751 to cover the patterned conductive layer 701a and the sacrificial layer 752. A thickness of the dielectric layer 700a is larger than that of the sacrificial layer 752. The size of the sacrificial layer 752 defines the size of a cavity which will be formed once the sacrificial layer 752 is removed. The dielectric layer 700a may be formed by laminating a dielectric material to the metal layer 751 and the sacrificial layer 752, for example. The dielectric layer 700a may include a material such as PP, BT, epoxy, PI, or another dielectric material. The dielectric layer 700a may have a thickness from approximately 5 μm to approximately 30 μm. In some embodiments, the metal layer 751 is used as a seed layer to form the patterned conductive layer 701a by pattern plating.

A patterned conductive layer 701b is formed on the dielectric layer 700a. The patterned conductive layer 701b may be formed, for example, using photo-lithography and plating technology. In some embodiments, the patterned conductive layer 701b is a relatively flat and smooth patterned conductive layer. The patterned conductive layer 701b may include, but is not limited to, Cu or another metal or alloy. The patterned conductive layer 701b can be formed by a semi-additive process (SAP) or a modified semi-additive process (MSAP).

A sacrificial layer 753 is formed on the dielectric layer 700a. In some embodiments, the sacrificial layer 753 may be a dry film or formed of a coating film, peelable adhesive or other suitable materials.

Figure 7C:
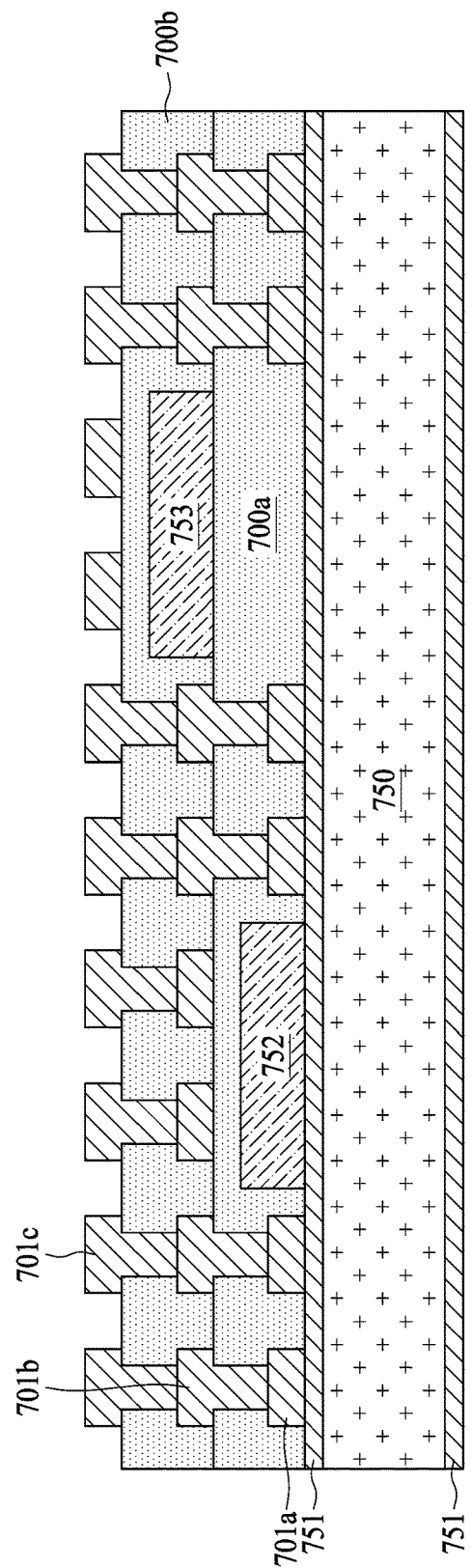

Referring FIG. 7C, a dielectric layer 700b is formed on the dielectric layer 700a to cover the patterned conductive layer 701b and the sacrificial layer 753. A thickness of the dielectric layer 700b is larger than that of the sacrificial layer 753. The dielectric layer 700b may be formed by laminating a dielectric material to the dielectric layer 700a, for example. The dielectric layer 700b may include a material such as PP, BT, epoxy, PI, or another dielectric material.

A patterned conductive layer 701c is formed on the dielectric layer 700b. The patterned conductive layer 701c may be formed, for example, using photo-lithography and plating technology. The patterned conductive layer 701c may include, but is not limited to, Cu or another metal or alloy.

Figure 7D:
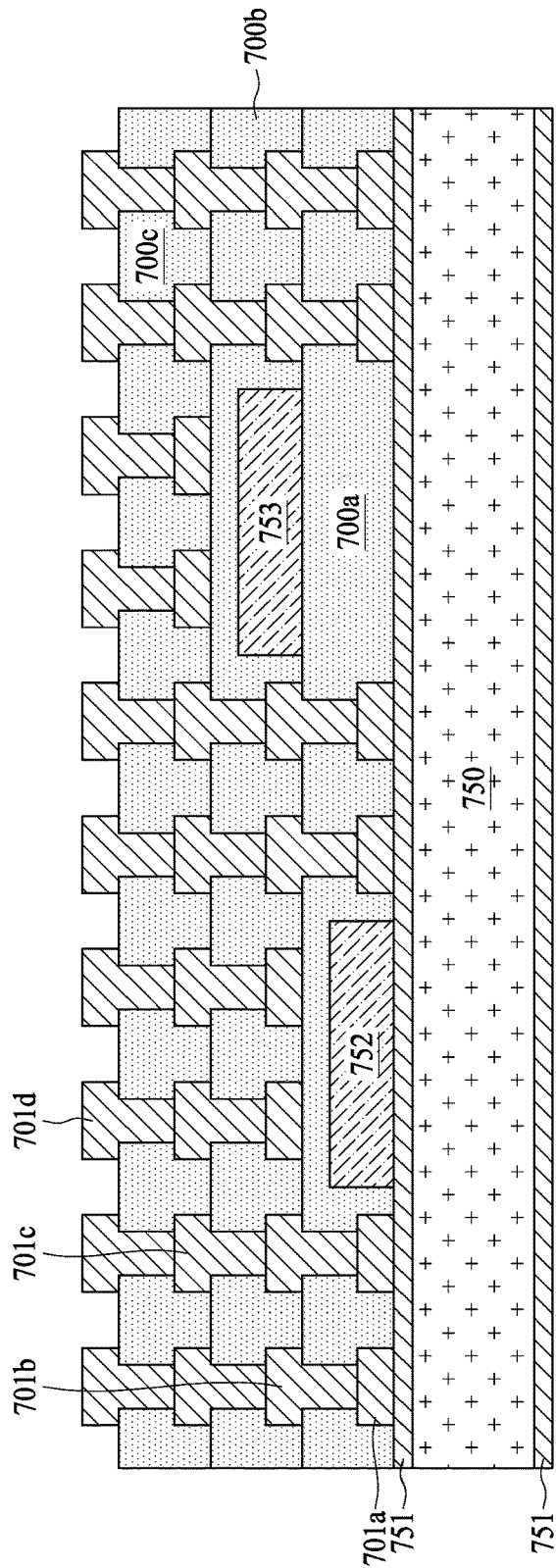

Referring FIG. 7D, a dielectric layer 700c is formed on the dielectric layer 700b to cover the patterned conductive layer 701c. The dielectric layer 700c may be formed by laminating a dielectric adhesive material to the dielectric layer 700b, for example. The dielectric layer 700c may include a material such as PP, BT, epoxy, PI, or another dielectric material. The dielectric layer 700c may have a thickness from approximately 5 μm to approximately 30 μm. In some embodiments, the patterned conductive layer 701c can be formed by a SAP or a MSAP.

A patterned conductive layer 701d is formed on the dielectric layer 700c. The patterned conductive layer 701d may be formed, for example, using photo-lithography and plating technology. The patterned conductive layer 701d may include, but is not limited to, Cu or another metal or alloy.

Figure 7E:
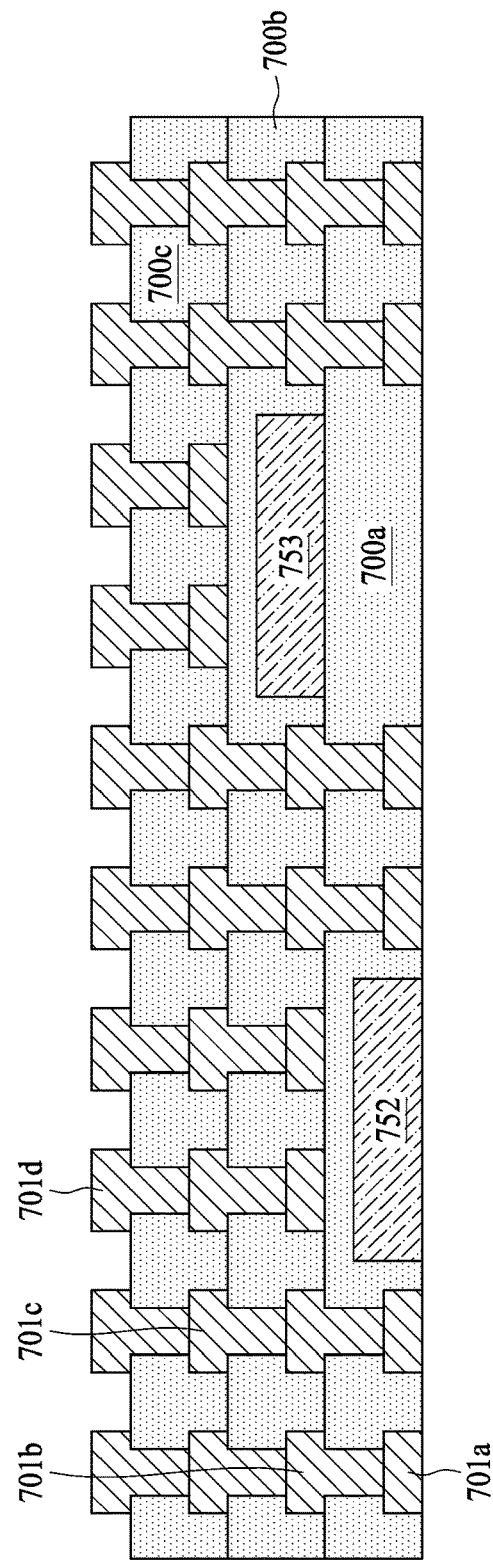

Referring to FIG. 7E, the patterned conductive layers 701a, 701b, 701c, 701d, the dielectric layers 700a, 700b, 700c and the sacrificial layers 752, 753 are separated from the carrier 750 and the metal layer 751. In other words, the carrier 750 and the metal layer 751 are removed from the structure formed thereon.

Figure 7F:
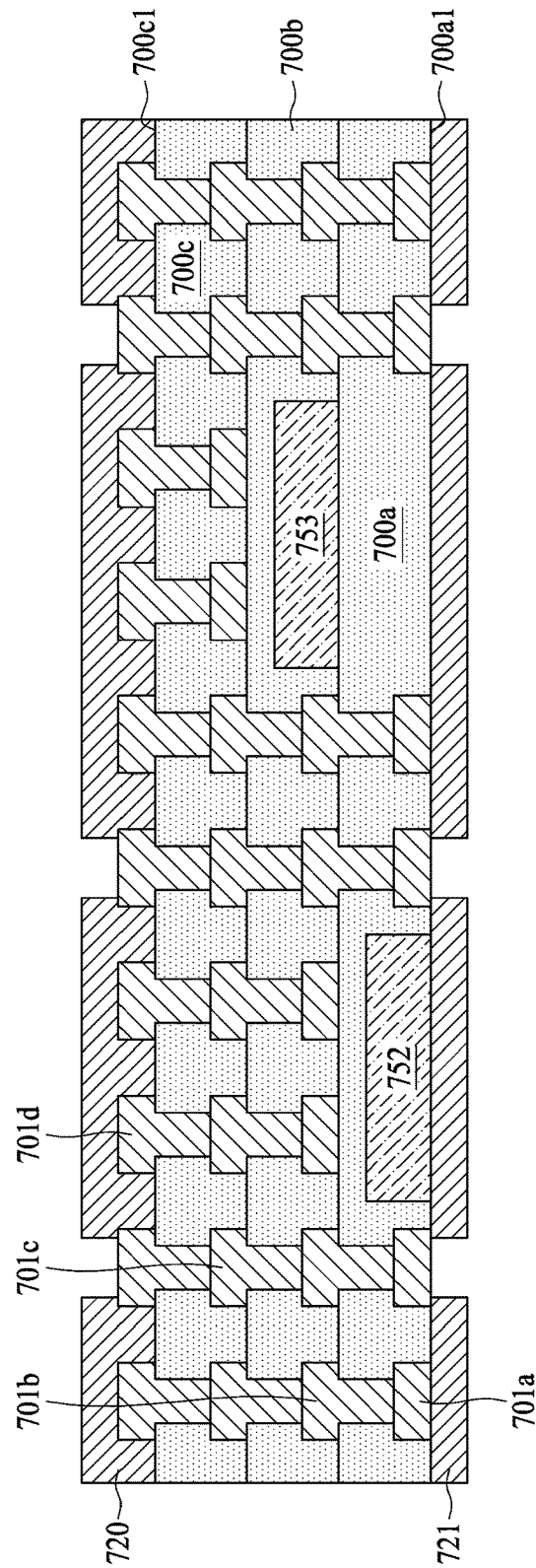

Referring to FIG. 7F, a solder resist layer 720 is formed on a top surface 700c1 of the dielectric layer 700c. The solder resist layer 720 covers the dielectric layer 700c and exposes the patterned conductive layer 701d. A solder resist layer 721 is formed on the bottom surface 700a1 of the dielectric layer 700a. The solder resist layer 721 covers the dielectric layer 700a and exposes the patterned conductive layer 701a.

Figure 7G:
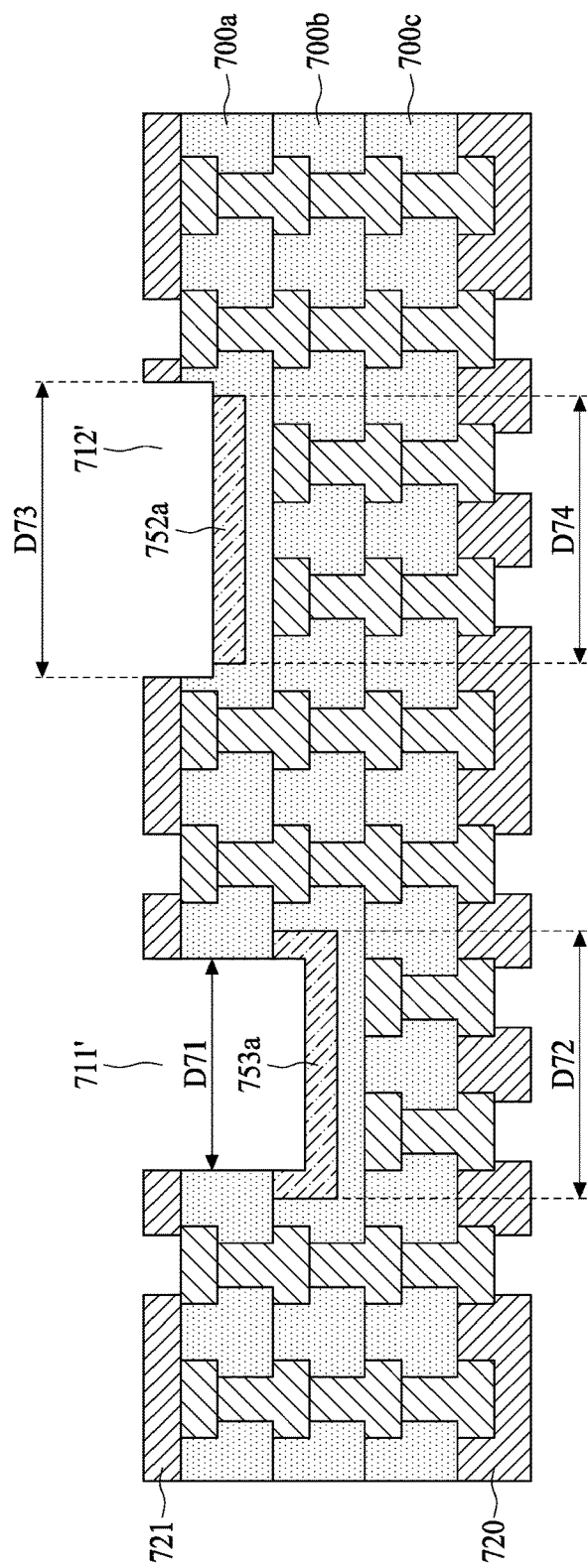

Referring to FIG. 7G, the structure in FIG. 7F is reoriented upside down, and then cavities 711' and 712' are formed. The cavity 711' is formed by removing a portion of the solder resist layer 721, a portion of the dielectric layer 700a and a portion of the sacrificial layer 753, with a remaining a portion 753a of the sacrificial layer 753. In some embodiments, the solder resist layer 721, the dielectric layer 700a and the sacrificial layer 753 can be removed by a mechanical drilling process. A width D71 of the cavity 711' formed by mechanical drilling is less than a width D72 of the remaining sacrificial layer 753a. In other embodiments, the width of the cavity 711' formed by the mechanical drilling can be greater than the width of the remaining sacrificial layer 753a.

The cavity 712' is formed by removing a portion of the solder resist layer 721, a portion of the dielectric layer 700a and a portion of the sacrificial layer 752, with a remaining a portion 752a of the sacrificial layer 752. In some embodiments, the solder resist layer 721, the dielectric layer 700a and the sacrificial layer 752 can be removed by a mechanical drilling process. A width D73 of the cavity 712' formed by mechanical drilling is greater than a width D74 of the remaining sacrificial layer 752a. In other embodiments, the width of the cavity 712' formed by the mechanical drilling can be less than the width of the remaining sacrificial layer 752a.

Figure 7H:
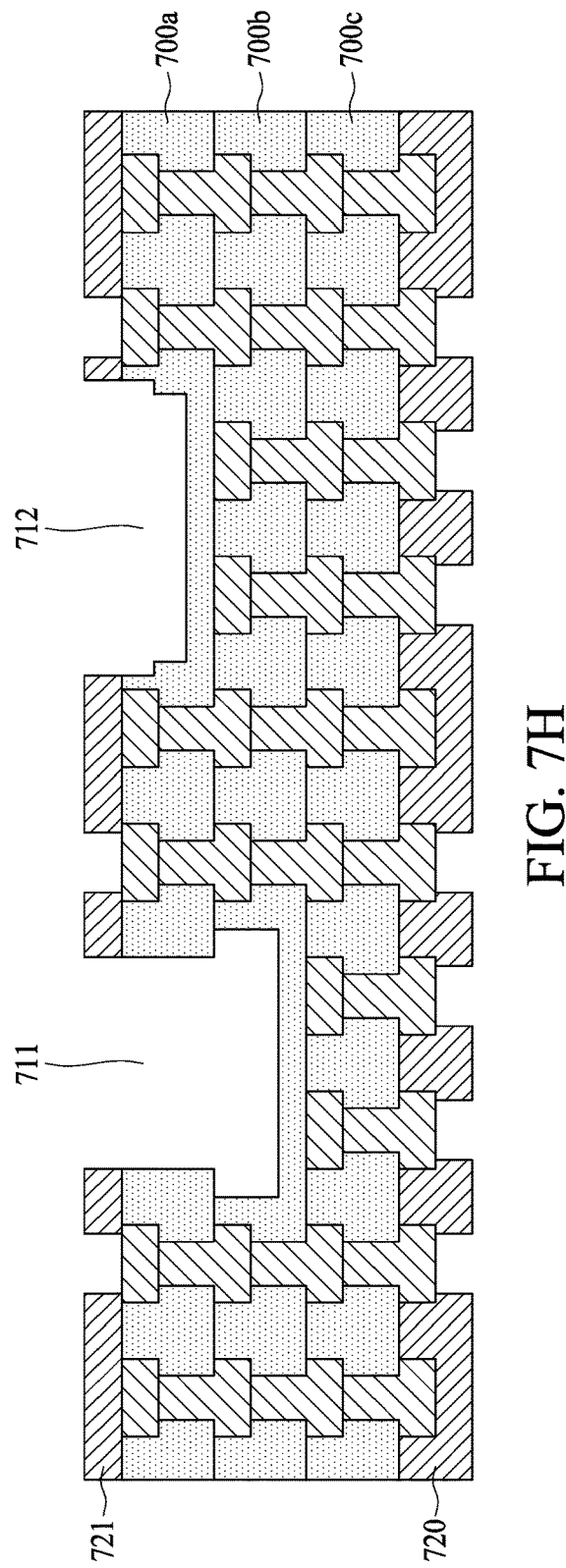

Referring to FIG. 7H, the remaining sacrificial layers 752a, 753a are removed to form cavities 711, 712, respectively. In some embodiments, the sacrificial layers 752a, 753a can be removed by chemical etching.

Figure 7I:
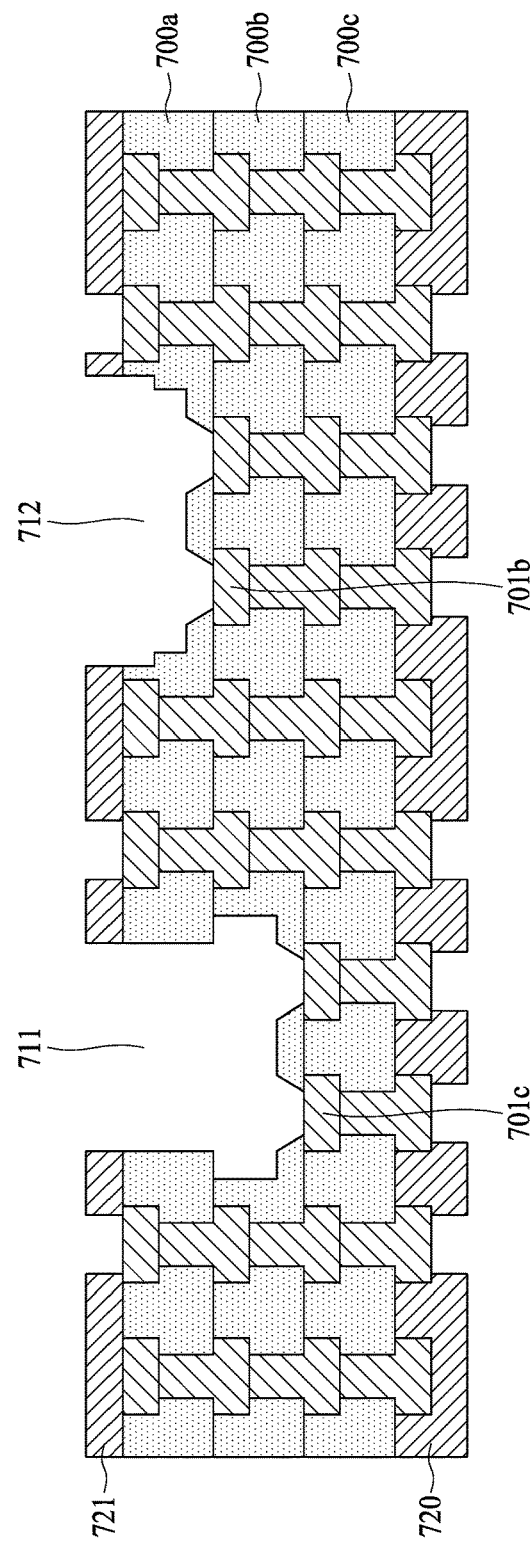

Referring to FIG. 7I, a portion of the dielectric layer 700b is removed to expose a portion of the patterned conductive layer 701c, and a portion of the dielectric layer 700a is removed to expose a portion of the patterned conductive layer 701b. In some embodiments, the dielectric layers 700a, 700b can be removed by drilling, laser drilling, etching or other suitable processes. In some embodiments, a resulting semiconductor substrate shown in FIG. 7I is similar to the semiconductor substrate 1 shown in FIG. 1.

By using the manufacturing processes shown in FIGS. 7A-7I, deposition of a release layer to form a cavity may be omitted, which otherwise may adversely affect subsequent processes. In some approaches without using a sacrificial layer, when mechanical drilling is carried out to form a cavity, a bottom surface of the cavity may be uneven due to a deviation (e.g., ±15 μm) of the mechanical drilling process. In the embodiments of the present disclosure, because the sacrificial layers 752, 753 are included prior to the formation of the cavities 711 and 712, any uneven surfaces would be formed on the surfaces of the remaining sacrificial layers 752a, 753a during the mechanical drilling process shown in FIG. 7G. After the remaining sacrificial layers 752a, 753a are removed, the cavities 711, 712 with substantially flat bottom surfaces are formed. Therefore, by using the processes shown in FIGS. 7A-7I, a fine pith of the cavities 711, 712 can be achieved, which would increase the performance of electronic components disposed within the cavities 711, 712. In addition, the use of the sacrificial layers 752, 753 can prevent interconnection structures from being damaged when the cavities 711, 712 are formed. For example, as shown in in FIGS. 7A-7I, it is desired to form the cavity 711 into a second layer of a dielectric layer (e.g., the dielectric layer 700b) by drilling the dielectric layers 700a and 700b. In some embodiments, the thickness of a single dielectric layer is approximately 30 µm and the deviation of the mechanical drilling machine is ±15 µm. If the sacrificial layer 753 is not formed before the drilling process, such deviation might cause an undesired drilling into the dielectric layer 700c, which can damage the interconnection structures within the dielectric layer 700c. By using the sacrificial layer 753 as a buffer, adverse impact of undesired drilling can be avoided even if the maximum deviation of the drilling machine occurs during the drilling process, which can protect the interconnection structures from being damaged.

FIGS. 8A-8K illustrate a semiconductor manufacturing method in accordance with some embodiments of the present disclosure.

Figure 8A:
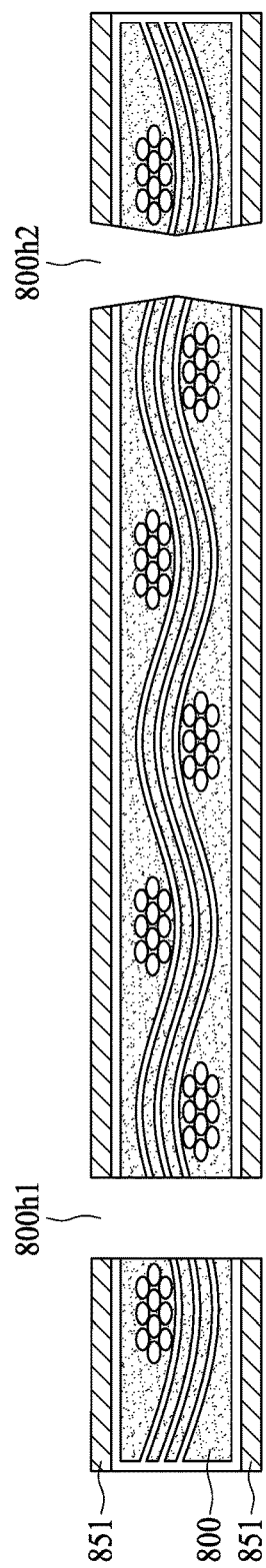
FIG. 8A, FIG. 8B, FIG. 8C, FIG. 8D, FIG. 8E, FIG. 8F, FIG. 8G, FIG. 8H, FIG. 8I, FIG. 8J, and FIG. 8K illustrate a manufacturing method in accordance with some embodiments of the present disclosure.

Referring to FIG. 8A, a core structure 800 is provided. The core structure 800 may be, for example, a silicon substrate, a plastic substrate or a ceramic substrate.

A metal layer 851 is formed on a top surface and a bottom surface of the core structure 800. The metal layer 851 may be a thin sheet. In some embodiments, the metal layer 851 has a thickness of approximately 2 µm. In some embodiments, the metal layer 851 includes Cu or another conductive material.

Through holes 800h1, 800h2 are then formed to penetrate the core structure 800 and the metal layer 851. In some embodiments, the hole 800h1 is formed by machine drilling and the hole 800h2 is formed by laser drilling. Alternatively, the holes 800h1, 800h2 can be formed by etching or other suitable processes.

Figure 8B:
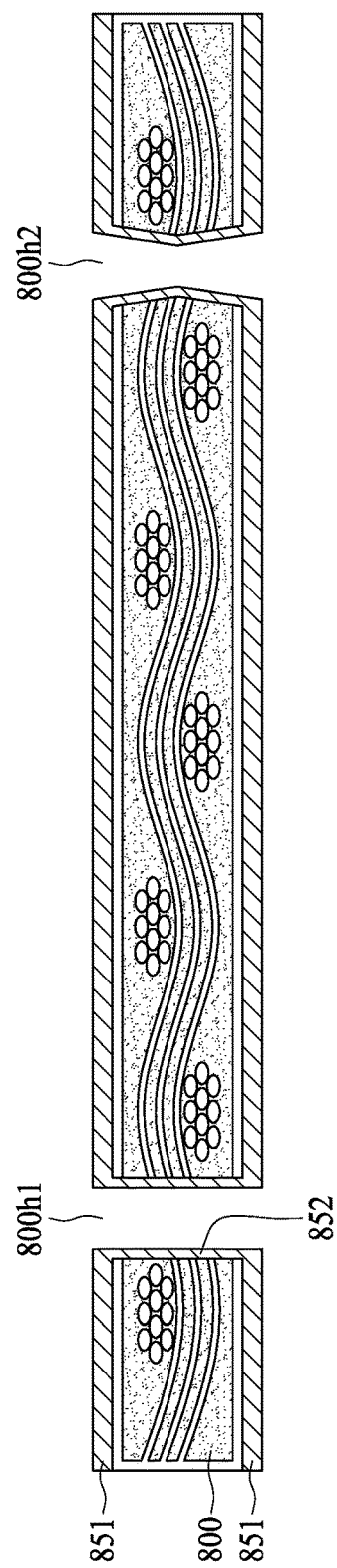

Referring to FIG. 8B, a through hole desmear process is carried out to remove residues remaining at sidewalls of the through holes 800h1, 800h2. Then, a metal layer 852 is formed on the sidewalls of the through holes 800h1, 800h2. The metal layer 852 can be formed by electroless plating, such as chemical plating or autocatalytic plating.

Figure 8C:
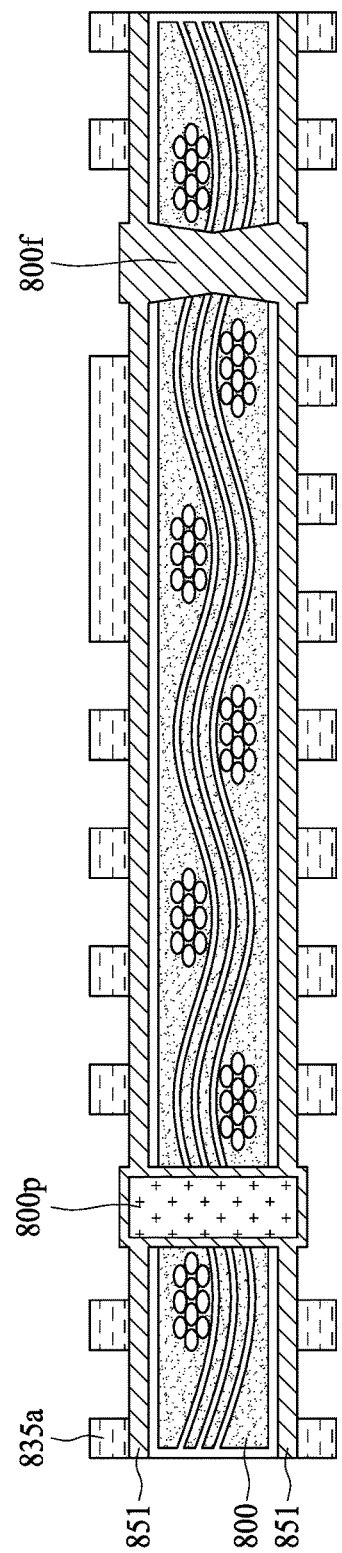

Referring to FIG. 8C, conductive vias 800p, 800f are formed to fill the through holes 800h1, 800h2. In some embodiments, the conductive via 800p can be formed by plug-in, and the conductive via 800f can be formed by plating. A patterned layer 835a is then formed on the metal layer 851.

Figure 8D:
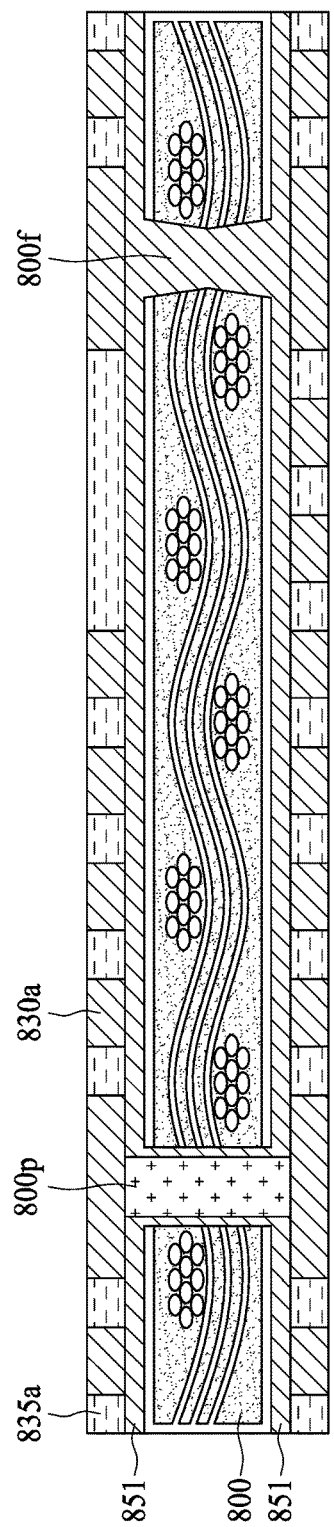

Referring to FIG. 8D, a conductive layer 830a is formed on portions of the metal layer 851 that are not covered by the patterned layer 835a. In some embodiments, the conductive layer 830a can be formed by plating or other suitable process. In some embodiments, the conductive layer 830a includes Cu or another conductive material.

Figure 8E:
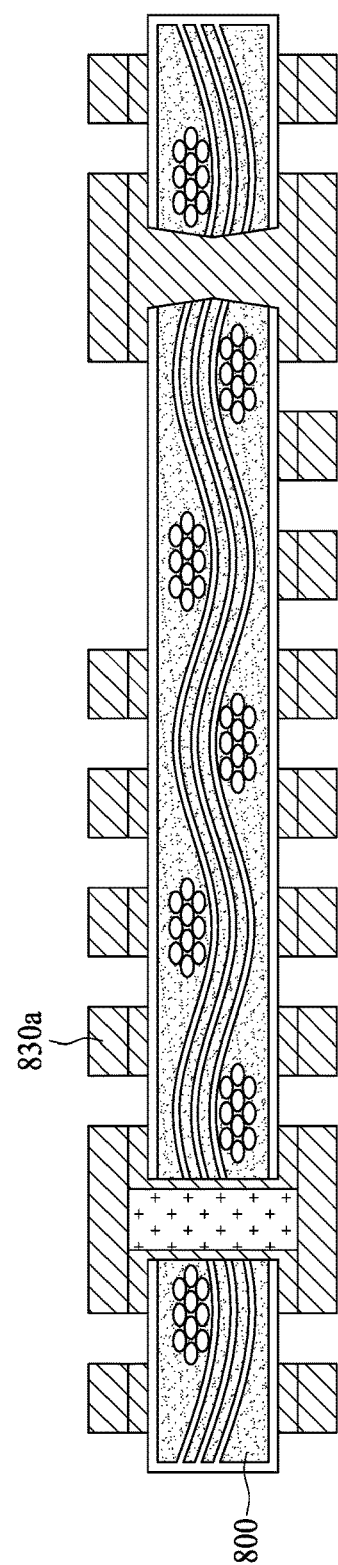

Referring to FIG. 8E, the patterned layer 835a is removed. In some embodiments, the patterned layer 835a can be removed by stripping. Exposed portions of the metal layer 851 are then removed. In some embodiments, the metal layer 851 can be removed by etching.

Figure 8F:
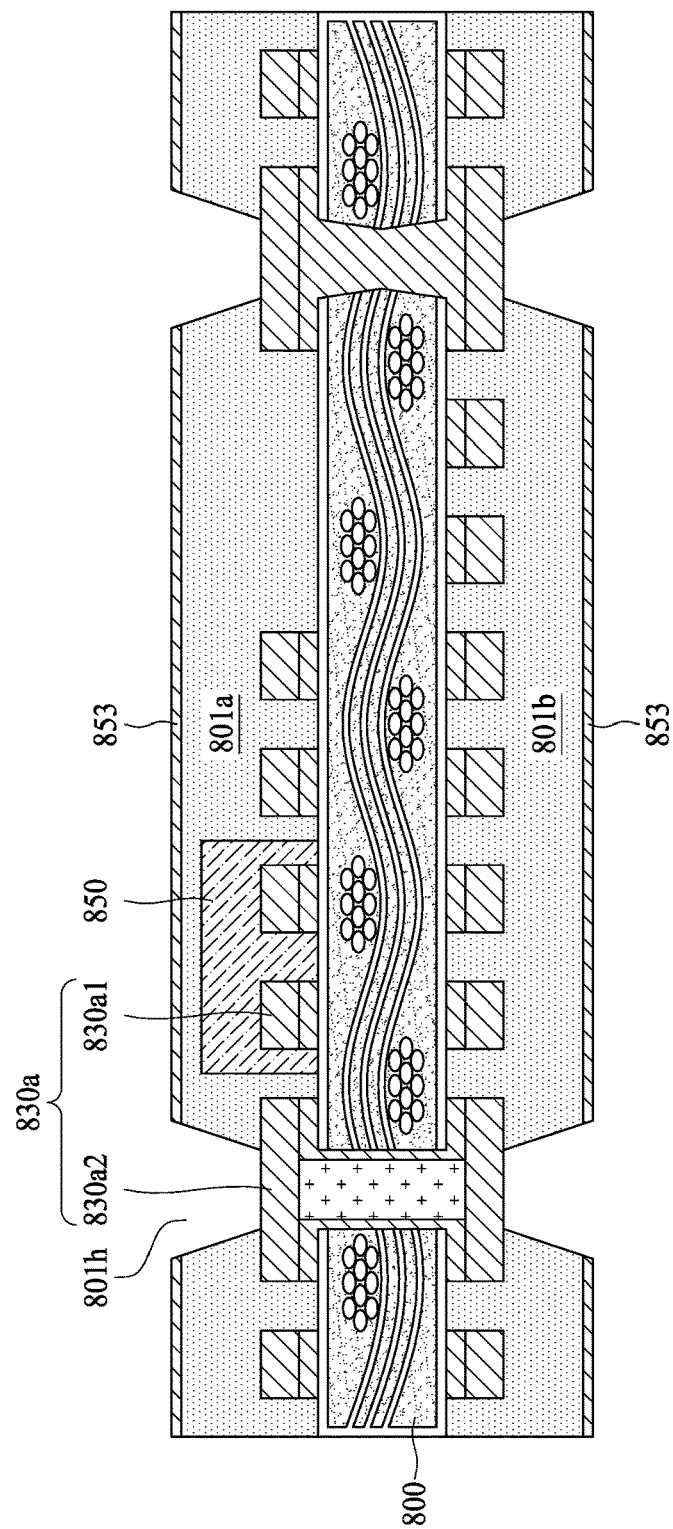

Referring to FIG. 8F, a sacrificial layer 850 is formed on a portion of the top surface of the core structure 800 and covers a portion 803a1 of the conductive layer 830a. The sacrificial layer 850 may be a dry film or may be formed of a coating film, peelable adhesive or other suitable materials.

Dielectric layers 801a, 801b are formed on the top surface and the bottom surface of the core structure 800 to cover the conductive layer 830a and the sacrificial layer 850. The dielectric layers 801a, 801b may be formed by laminating a dielectric adhesive material to the core structure 800, for example. The dielectric layers 801a, 801b may include a material such as PP, BT, epoxy, PI, or another dielectric material. The dielectric layers 801a, 801b may each have a thickness from approximately 5 µm to approximately 30 µm.

A metal layer 853 is formed on the dielectric layers 801a, 801b. The metal layer 853 may be a thin sheet. In some embodiments, the metal layer 853 has a thickness of approximately 2 µm. In some embodiments, the metal layer 853 includes Cu or another conductive material.

Holes 801h are then formed to penetrate the metal layer 853 and the dielectric layers 801, 801b to expose portions 830a2 of the conductive layer 830a. The holes 801h can be formed by, for example, drilling, laser drilling, etching or other suitable processes.

Figure 8G:
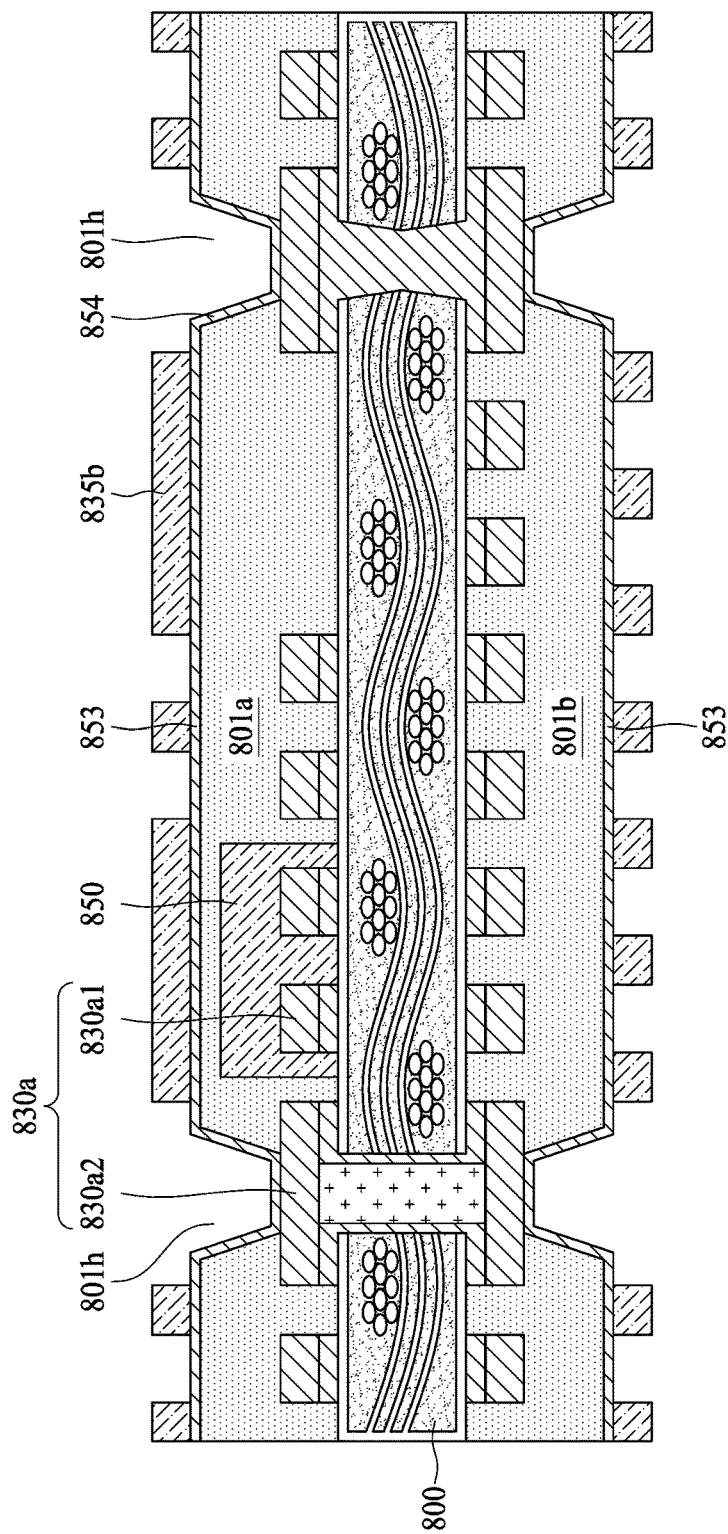

Referring to FIG. 8G, a desmear process is carried out to remove residues remaining at sidewalls of the holes 801h. Then, a metal layer 854 is formed on the sidewalls of the holes 801h. The metal layer 854 can be formed by electroless plating or sputtering.

A patterned layer 835b is then formed on the metal layer 853. In some embodiments, the patterned layer 835b may be a dry film or may be formed of a coating film, peelable adhesive or other suitable materials.

Figure 8H:
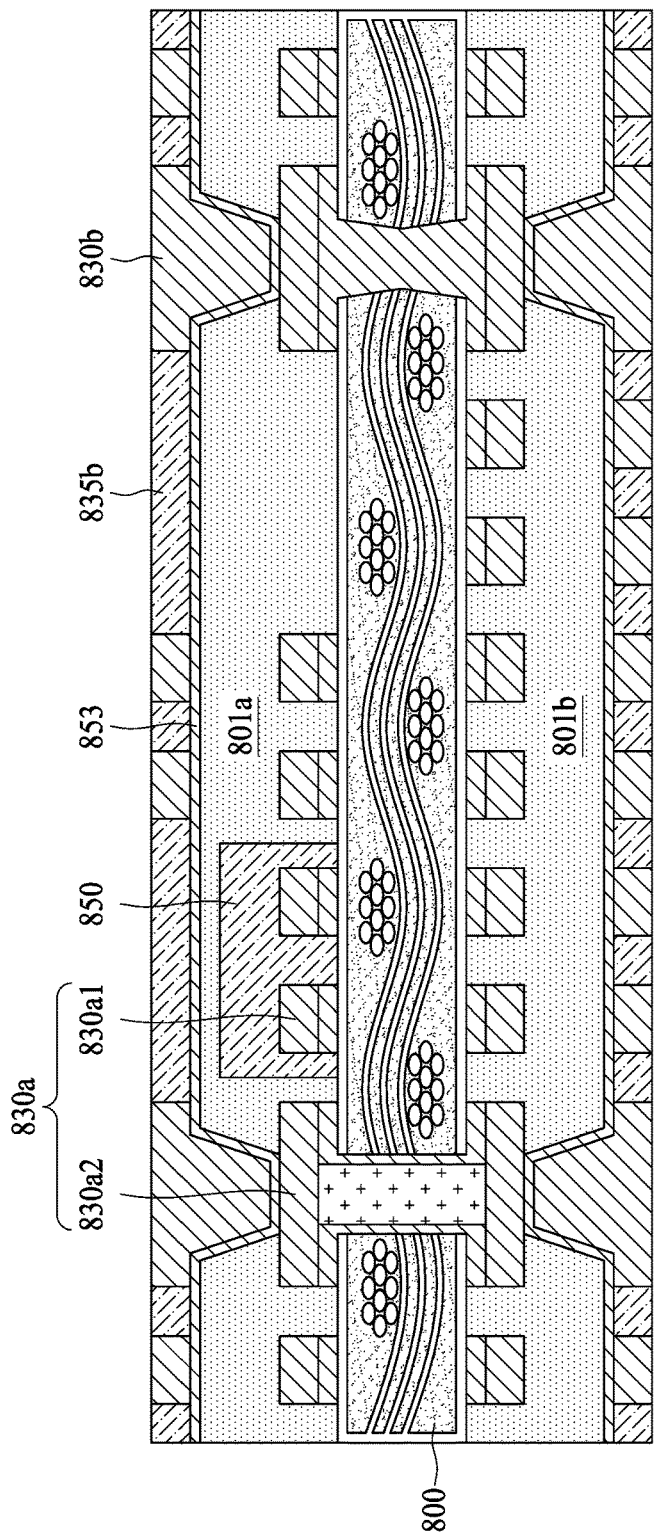

Referring to FIG. 8H, a conductive layer 830b is formed on portions of the metal layer 853 that are not covered by the patterned layer 835b. In some embodiments, the conductive layer 830b can be formed by plating or other suitable process. In some embodiments, the conductive layer 830b includes Cu or another conductive material.

Figure 8I:
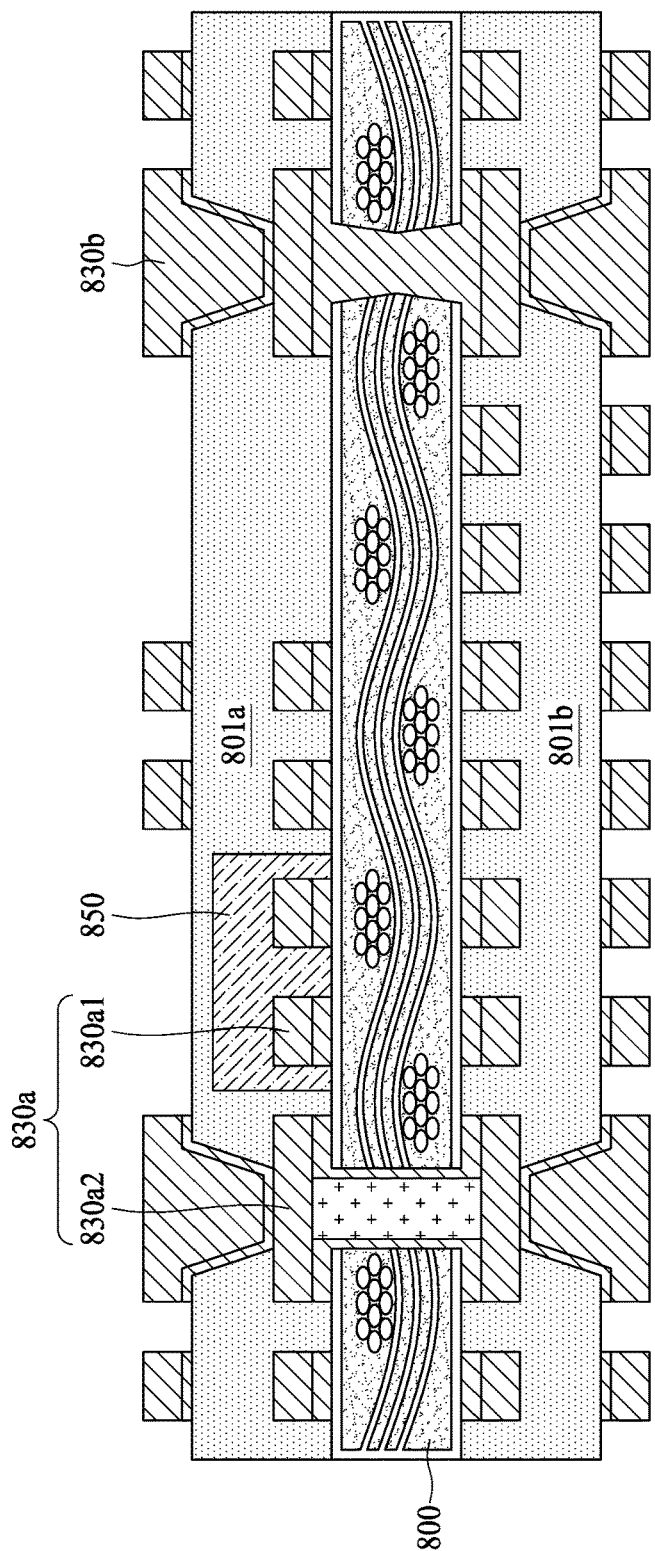

Referring to FIG. 8I, the patterned layer 835b is removed. In some embodiments, the patterned layer 835b can be removed by stripping. Exposed portions of the metal layer 853 are then removed. In some embodiments, the metal layer 853 can be removed by etching.

Figure 8J:
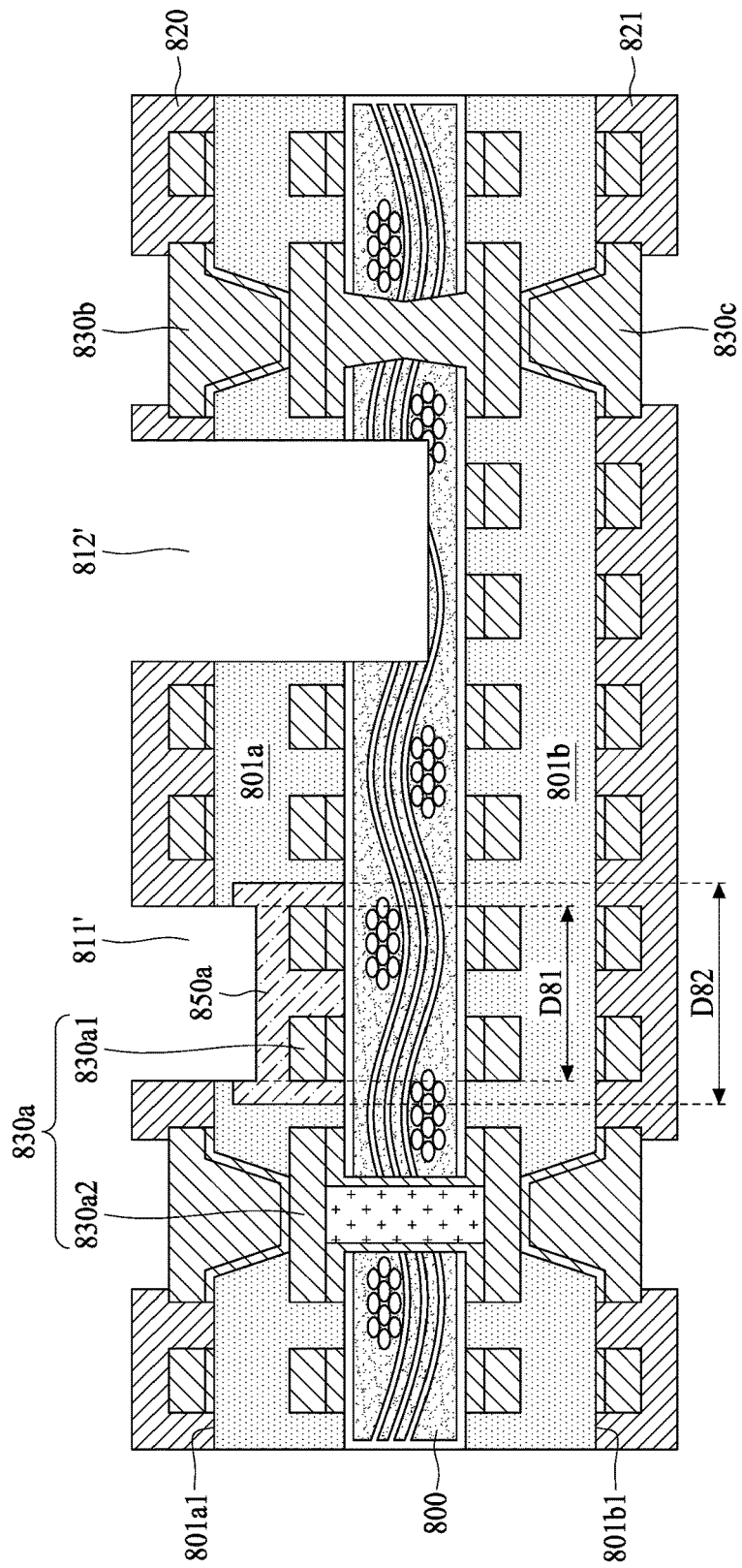

Referring to FIG. 8J, a solder resist layer 820 may be formed on a top surface 801a1 of the dielectric layer 801a. The solder resist layer 820 covers the dielectric layer 801a and exposes the conductive layer 830b. A solder resist layer 821 may be formed on a bottom surface 801b1 of the dielectric layer 801b. The solder resist layer 821 covers the dielectric layer 801b and exposes a conductive layer 830c.

Cavities 811' and 812' are formed. The cavity 811' is formed by removing a portion of the solder resist layer 820, a portion of the dielectric layer 801a and a portion of the sacrificial layer 850, with a remaining portion 850a of the sacrificial layer 850. In some embodiments, the solder resist layer 820, the dielectric layer 801a and the sacrificial layer 850 can be removed by a mechanical drilling process. A width D81 of the cavity 811' formed by mechanical drilling is less than a width D82 of the remaining sacrificial layer 850a. In other embodiments, the width of the cavity 811' formed by the mechanical drilling may be greater than the width of the remaining sacrificial layer 850a.

The cavity 812' is formed by removing a portion of the solder resist layer 820, a portion of the dielectric layer 801a and a portion of the core structure 800. In some embodiments, the solder resist layer 820, the dielectric layer 801*a* and the core structure 800 can be removed by a mechanical drilling process.

Figure 8K:
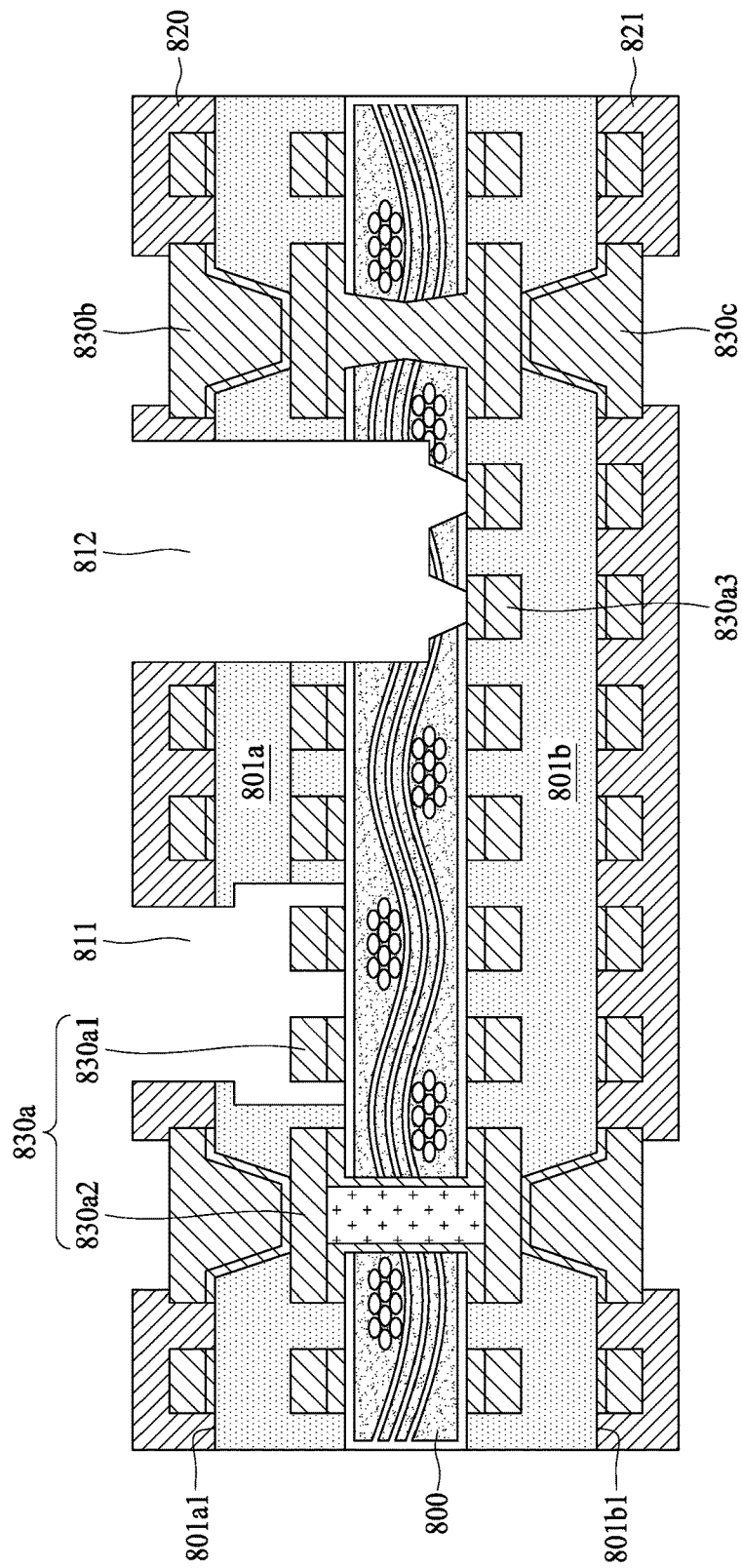

Referring to FIG. 8K, the remaining sacrificial layer 850*a* is removed to form the cavity 811. In some embodiments, the sacrificial layer 850*a* can be removed by chemical etching. After removing the sacrificial layer 850*a*, the portions 830*a*1 of the conductive layer 830*a* are exposed.

A portion of the core structure 800 is then removed to expose portions 830*a*3 of the conductive layer 830*a*. In some embodiments, the core structure 800 can be removed by drilling, laser drilling, etching or other suitable processes. In some embodiments, a resulting semiconductor substrate shown in FIG. 8K is similar to the semiconductor substrate 3 shown in FIG. 3.

FIGS. 9A-9H illustrate a semiconductor manufacturing method in accordance with some embodiments of the present disclosure.

Figure 9A:
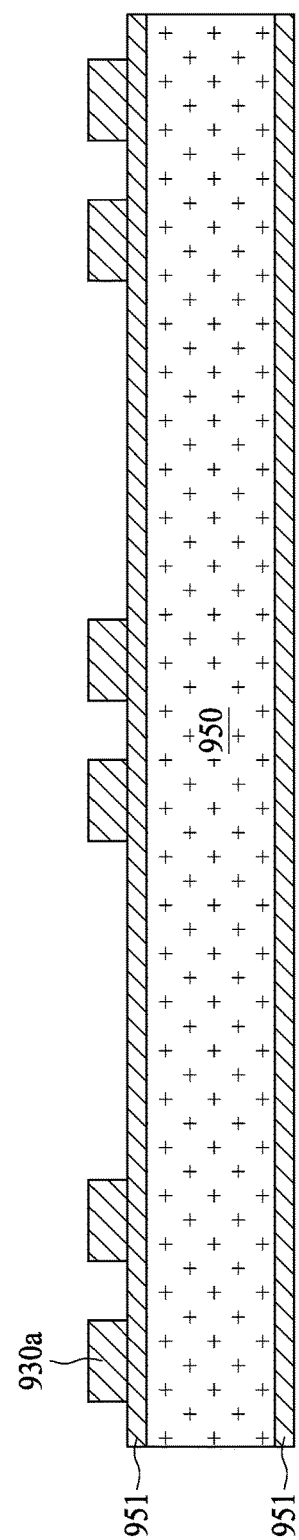
FIG. 9A, FIG. 9B, FIG. 9C, FIG. 9D, FIG. 9E, FIG. 9F, FIG. 9G, and FIG. 9H illustrate a manufacturing method in accordance with some embodiments of the present disclosure.

Referring to FIG. 9A, a carrier 950 is provided. The carrier 950 may be, for example, a silicon substrate, a plastic substrate or a metal panel. The carrier 950 may facilitate subsequent processes thereon.

A metal layer 951 is formed on a top surface and a bottom surface of the carrier 950. The metal layer 951 may be a thin sheet. In some embodiments, the metal layer 951 has a thickness of approximately 2 µm. In some embodiments, the metal layer 951 includes Cu or another conductive material.

A patterned conductive layer 930*a* is formed on the metal layer 951. The patterned conductive layer 930*a* may be formed, for example, using photo-lithography and plating technology. The patterned conductive layer 930*a* may include, but is not limited to, Cu or another metal or alloy.

Figure 9B:
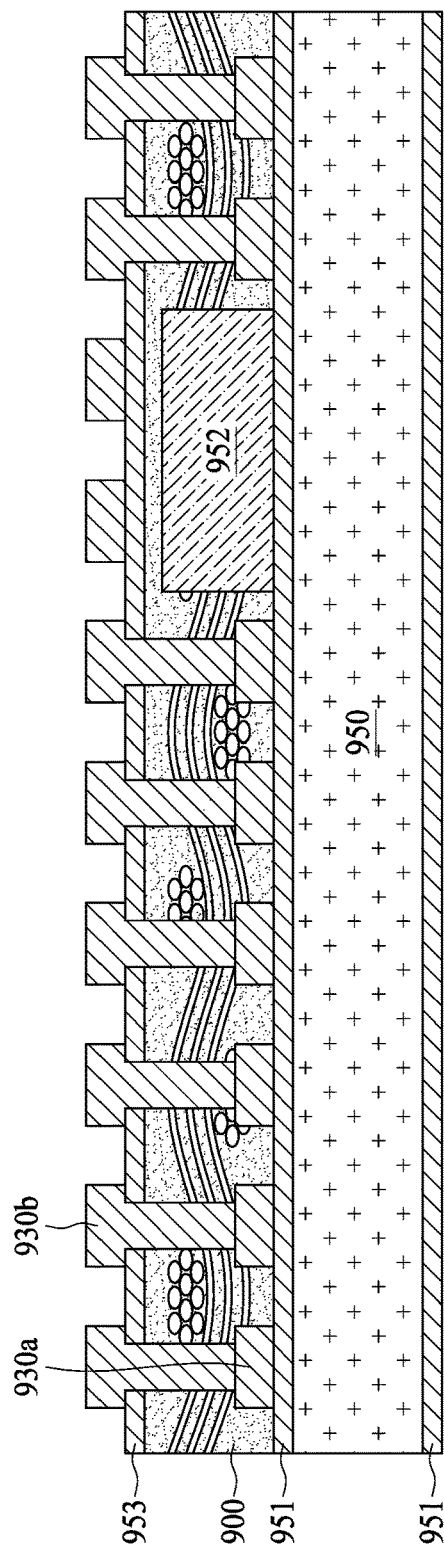

Referring to FIG. 9B, a sacrificial layer 952 is formed on the metal layer 951. In some embodiments, the sacrificial layer 952 may be a dry film or may be formed of a coating film, peelable adhesive or other suitable materials.

A core structure 900 is provided. The core structure 900 may be, for example, a silicon substrate, a plastic substrate or a ceramic substrate.

A metal layer 953 is formed on a top surface of the core structure 900. The metal layer 953 may be a thin sheet. In some embodiments, the metal layer 953 has a thickness of approximately 2 µm. In some embodiments, the metal layer 953 includes Cu or another conductive material.

A patterned conductive layer 930*b* is formed on the metal layer 953. The patterned conductive layer 930*b* may be formed, for example, using photo-lithography and plating technology. In some embodiments, the patterned conductive layer 930*b* is a relatively flat and smooth patterned conductive layer. The patterned conductive layer 930*b* may include, but is not limited to, Cu or another metal or alloy.

Figure 9C:
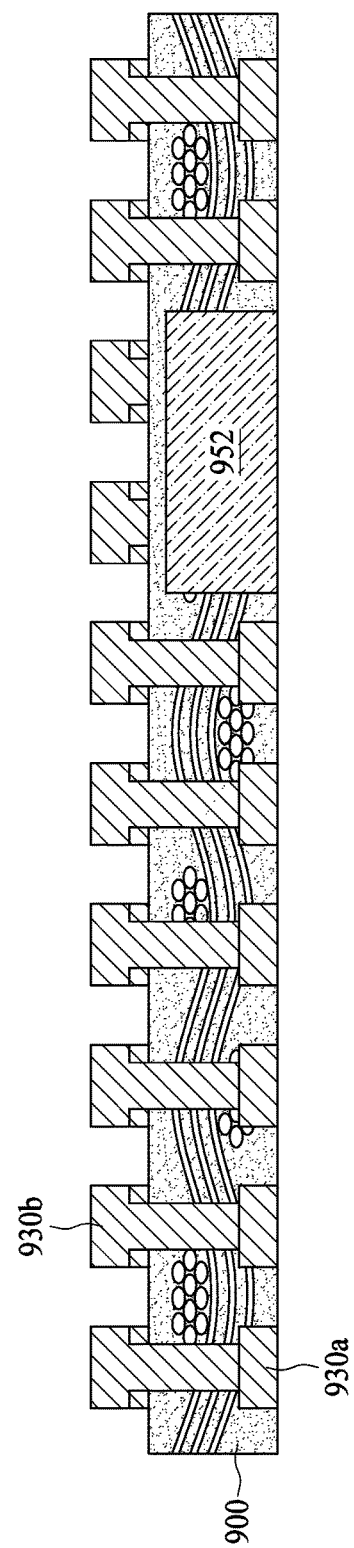

Referring to FIG. 9C, the carrier 950 and the metal layer 951 are removed from the structure formed thereon. Exposed portions of the metal layer 953 are then removed. In some embodiments, the metal layer 953 can be removed by etching.

Figure 9D:
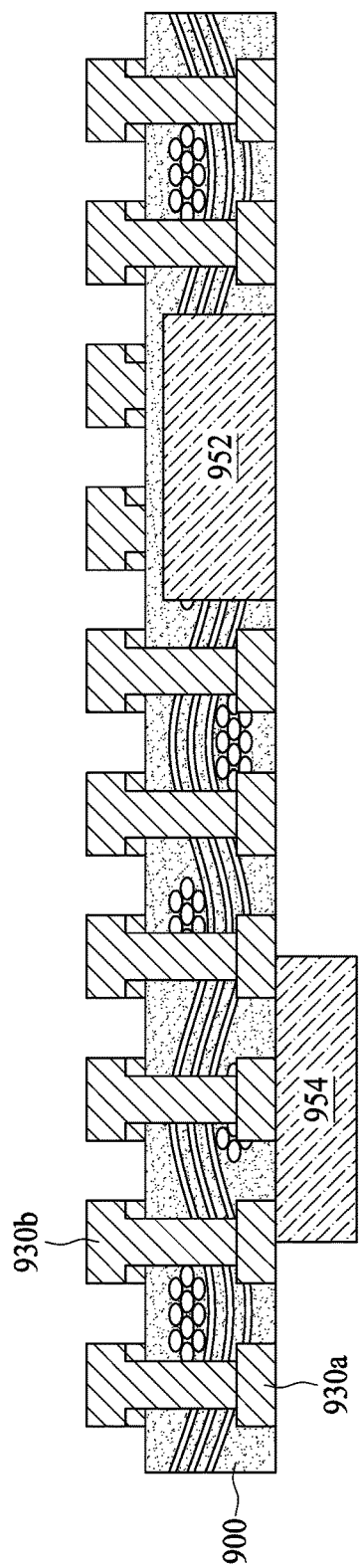

Referring to FIG. 9D, a sacrificial layer 954 is formed on a bottom surface of the core structure 900. In some embodiments, the sacrificial layer 954 may be a dry film, a peelable adhesive or other suitable materials.

Figure 9E:
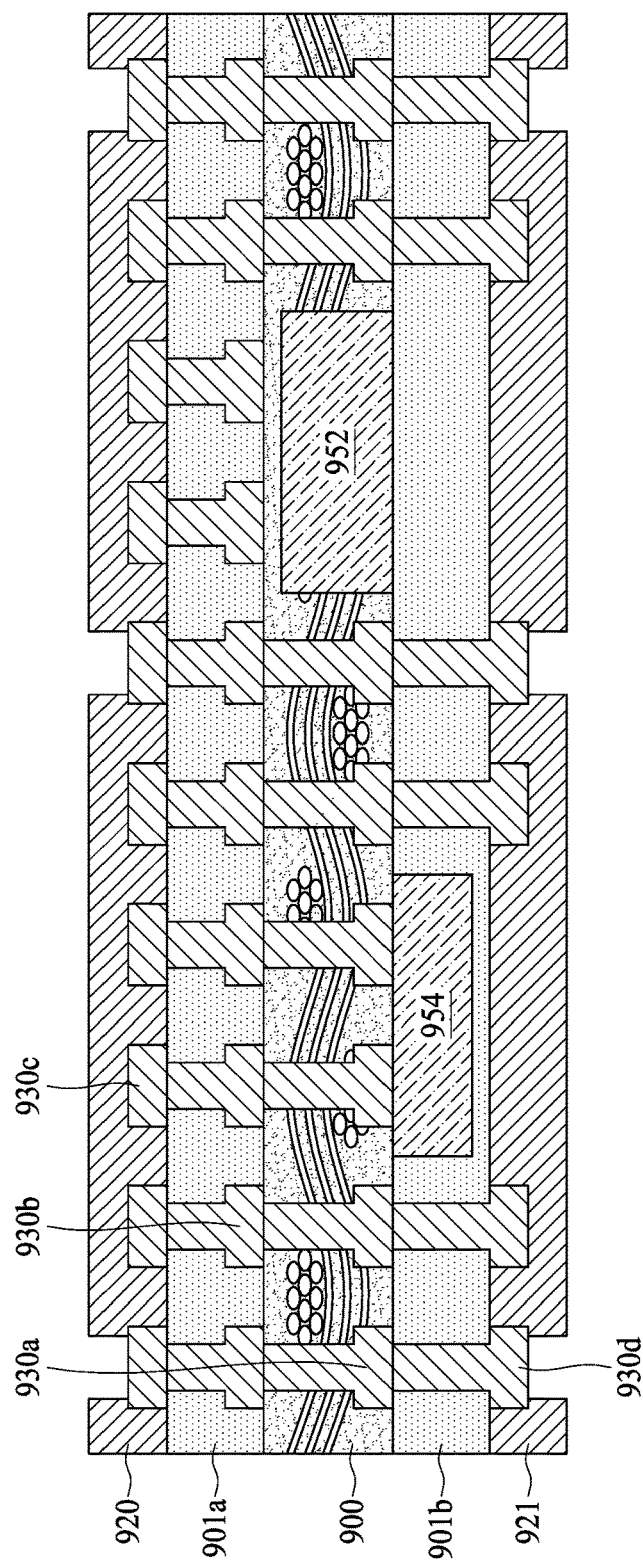

Referring to FIG. 9E, a dielectric layer 901*a* is formed on the top surface of the core structure 900 to cover the conductive layer 930*b*. A dielectric layer 901*b* is formed on the bottom surface of the core structure 900 to cover the sacrificial layer 954. The dielectric layers 901*a*, 901*b* may be formed by laminating a dielectric material to the core structure 900, for example. The dielectric layers 901*a*, 901*b* may include a material such as PP, BT, epoxy, PI, or another dielectric material. The dielectric layer 901*a*, 901*b* may each have a thickness from approximately 5 µm to approximately 30 µm.

A patterned conductive layer 930*c* is formed on the dielectric layer 901*a*. A patterned conductive layer 930*d* is formed on the dielectric layer 901*b*. The patterned conductive layers 930*c*, 930*d* may be formed, for example, using photo-lithography and plating technology. The patterned conductive layers 930*c*, 930*d* may include, but are not limited to, Cu or another metal or alloy.

A solder resist layer 920 is formed on a top surface of the dielectric layer 901*a*. The solder resist layer 920 covers the dielectric layer 901*a* and exposes the patterned conductive layer 930*c*. A solder resist layer 921 is formed on a bottom surface of the dielectric layer 901*b*. The solder resist layer 921 covers the dielectric layer 901*b* and exposes the patterned conductive layer 930*d*.

Figure 9F:
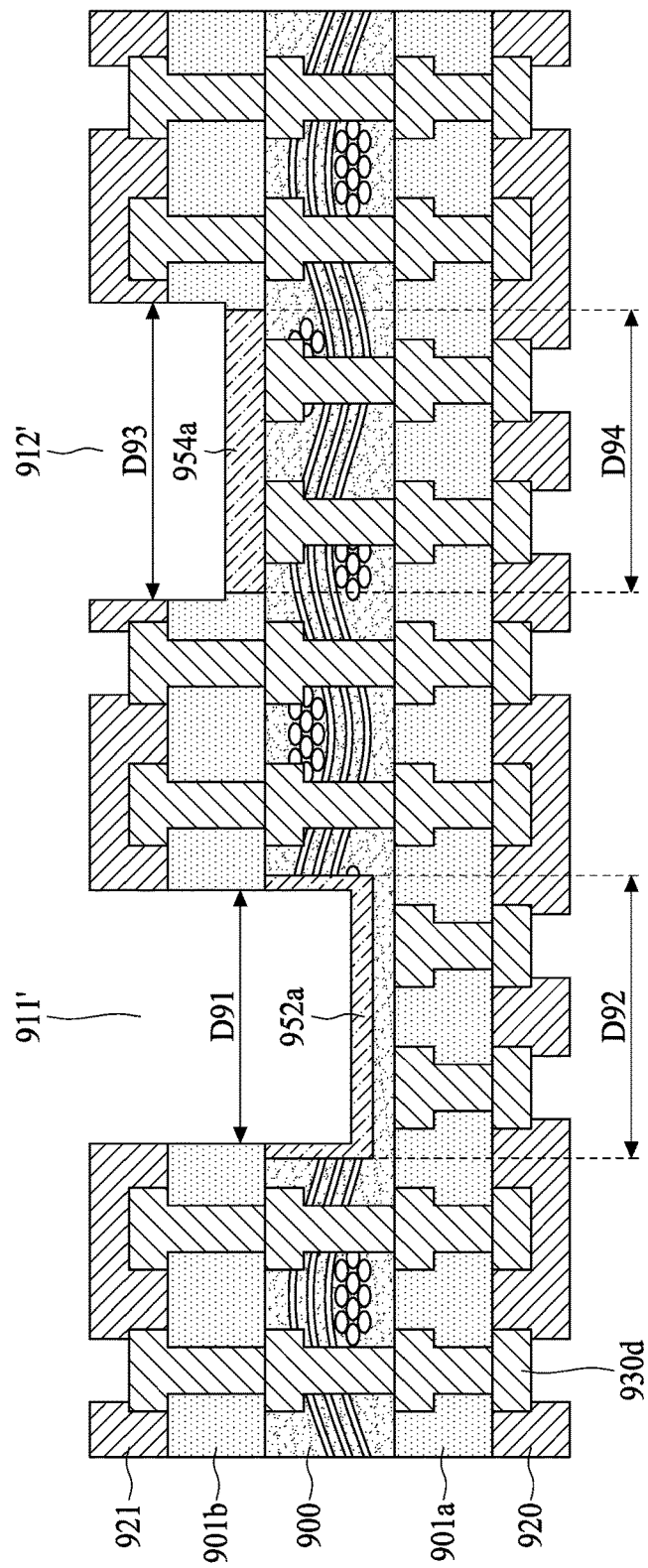

Referring to FIG. 9F, cavities 911', 912' are formed. The cavity 911' is formed by removing a portion of the solder resist layer 921, a portion of the dielectric layer 901*b*, a portion of the core structure 900 and a portion of the sacrificial layer 952, with a remaining portion 952*a* of the sacrificial layer 952. In some embodiments, the solder resist layer 921, the dielectric layer 901*b*, the core structure 900 and the sacrificial layer 952 can be removed by a mechanical drilling process. A width D91 of the cavity 911' formed by mechanical drilling is less than a width D92 of the remaining sacrificial layer 952*a*. In other embodiments, the width of the cavity 911' formed by the mechanical drilling may be greater than the width of the remaining sacrificial layer 952*a*.

The cavity 912' is formed by removing a portion of the solder resist layer 921, a portion of the dielectric layer 901*b*, and a portion of the sacrificial layer 954, with a remaining portion 954*a* of the sacrificial layer 954. In some embodiments, the solder resist layer 921, the dielectric layer 901*b* and the sacrificial layer 954 can be removed by a mechanical drilling process. A width D93 of the cavity 912' formed by mechanical drilling is greater than a width D94 of the remaining sacrificial layer 954*a*. In other embodiments, the width of the cavity 912' formed by the mechanical drilling may be less than the width of the remaining sacrificial layer 954*a*.

Figure 9G:
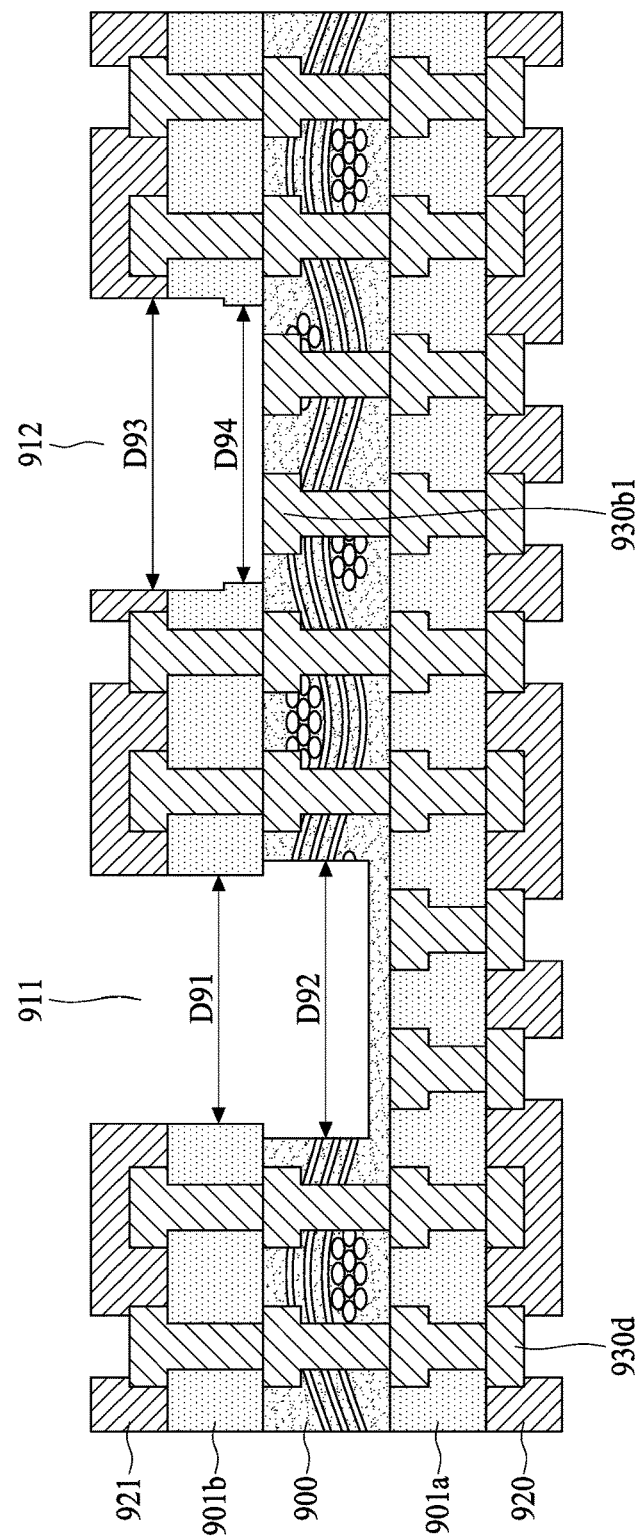

Referring to FIG. 9G, the remaining sacrificial layers 954*a*, 952*a* are removed to form cavities 911, 912, respectively. In some embodiments, the remaining sacrificial layers 952*a*, 954*a* can be removed by chemical etching. A top surface of an exposed portion 930*b*1 is substantially coplanar with the top surface of the core structure 900 and is not covered by the core structure 900, and thus the top surface of the exposed portion 930*b*1 of the patterned conductive layer 930*b* is directly exposed after the sacrificial layer 954*a* is removed.

Figure 9H:
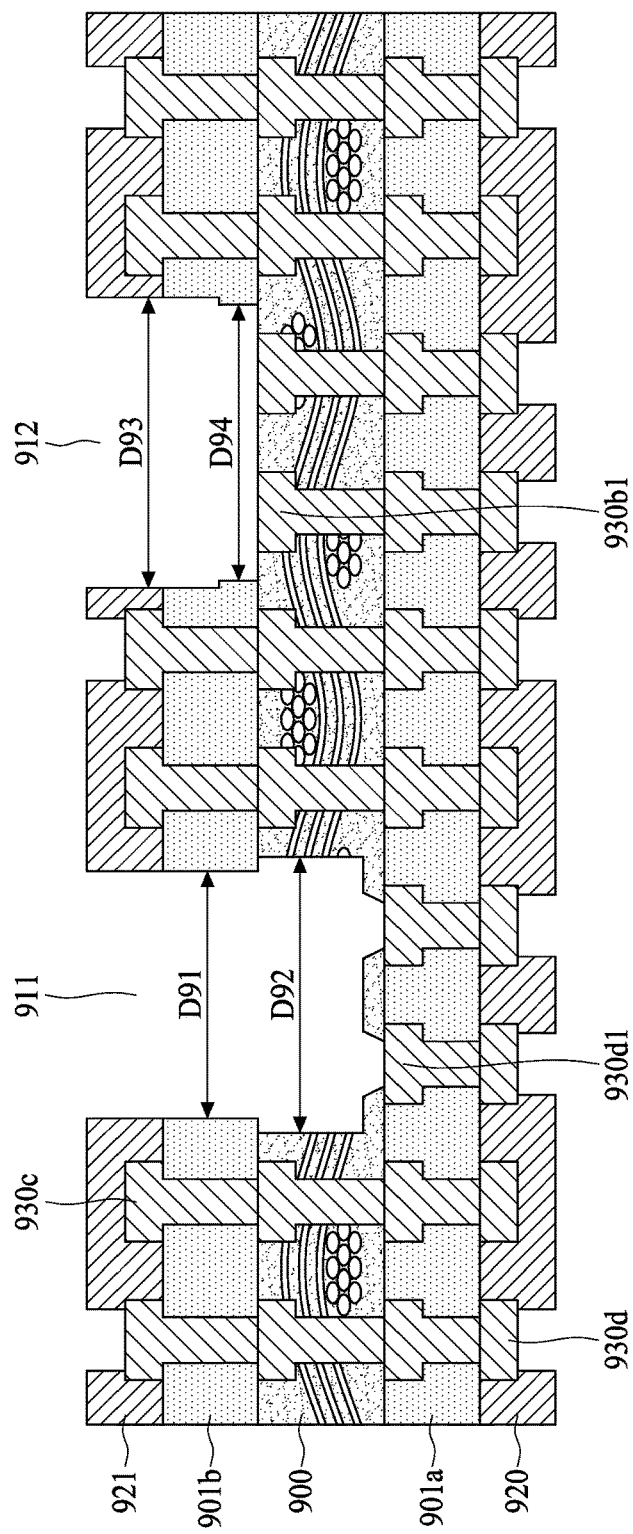

Referring to FIG. 9H, a portion of the core structure 900 is removed to expose a portion 930*d*1. In some embodiments, the core structure 900 can be removed by drilling, laser drilling, etching or other suitable processes.

FIGS. 10A-10G illustrate a semiconductor manufacturing method in accordance with some embodiments of the present disclosure.

Figure 10A:
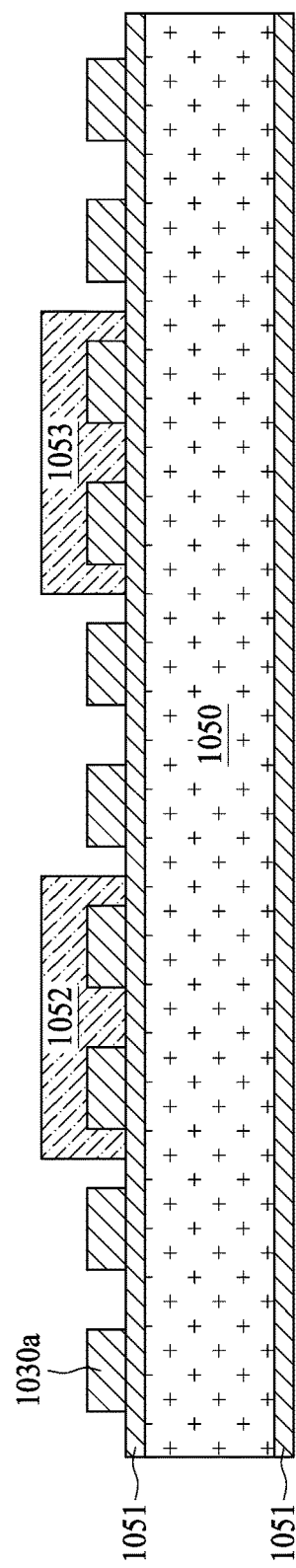
FIG. 10A, FIG. 10B, FIG. 10C, FIG. 10D, FIG. 10E, FIG. 10F, and FIG. 10G illustrate a manufacturing method in accordance with some embodiments of the present disclosure.

Referring to FIG. 10A, a carrier 1050 is provided. The carrier 1050 may be, for example, a silicon substrate, a plastic substrate or a metal panel. The carrier 1050 may facilitate subsequent processes thereon.

A metal layer 1051 is formed on a top surface and a bottom surface of the carrier 1050. The metal layer 1051 may be a thin sheet. In some embodiments, the metal layer 1051 has a thickness of approximately 2 μm. In some embodiments, the metal layer 1051 includes Cu, platinum (Pt) or another conductive material.

A patterned conductive layer 1030a is formed on the metal layer 1051. The patterned conductive layer 1030a may be formed, for example, using photo-lithography and plating technology. The patterned conductive layer 1030a may include, but is not limited to, Cu or another metal or alloy.

Sacrificial layers 1052, 1053 are formed on the metal layer 1051 and the patterned conductive layer 1030a. In some embodiments, the sacrificial layers 1052, 1053 may be a dry film or may be formed of a coating film, peelable adhesive or other suitable materials.

Figure 10B:
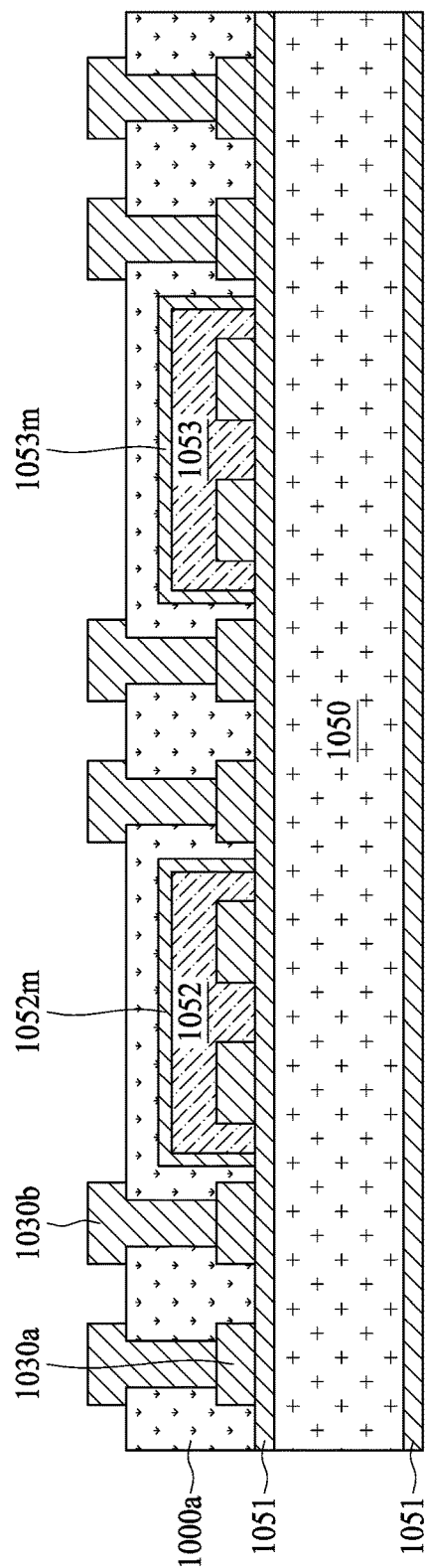

Referring to FIG. 10B, metal layers 1052m, 1053m are formed to respectively cover external surfaces of the sacrificial layers 1052, 1053. By forming the metal layers 1052m, 1053m on the external surfaces of the sacrificial layers 1052, 1053, removal of the sacrificial layers 1052, 1053 in subsequent processes is facilitated because a bonding between a metal (e.g., the metal layers 1052m, 1053m) and an organic material (e.g., a dielectric layer 1000a) is weaker than a bonding between two organic materials.

The dielectric layer 1000a is formed on the metal layer 1051 to cover the patterned conductive layer 1030a and the sacrificial layers 1052, 1053. The dielectric layer 1000a may be formed by laminating a dielectric adhesive material to the metal layer 1051, for example. The dielectric layer 1000a may include a material such as PP, BT, epoxy, PI, or another dielectric material. The dielectric layer 1000a may have a thickness from approximately 5 μm to approximately 30 μm.

A patterned conductive layer 1030b is formed on the dielectric layer 1000a. The patterned conductive layer 1030b may be formed, for example, using photo-lithography and plating technology. The patterned conductive layer 1030b may include, but is not limited to, Cu or another metal or alloy.

Figure 10C:
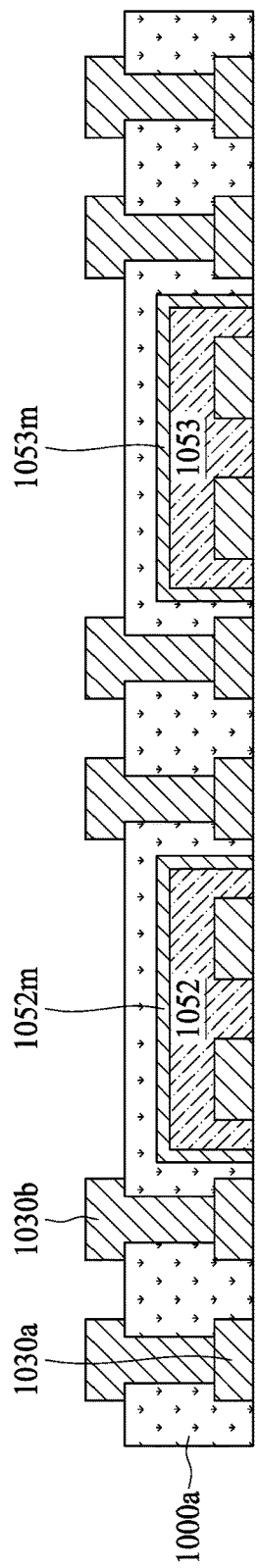

Referring to FIG. 10C, the carrier 1050 and the metal layer 1051 are removed from the structure formed thereon. In some embodiments the metal layer 1051 can be removed by etching.

Figure 10D:
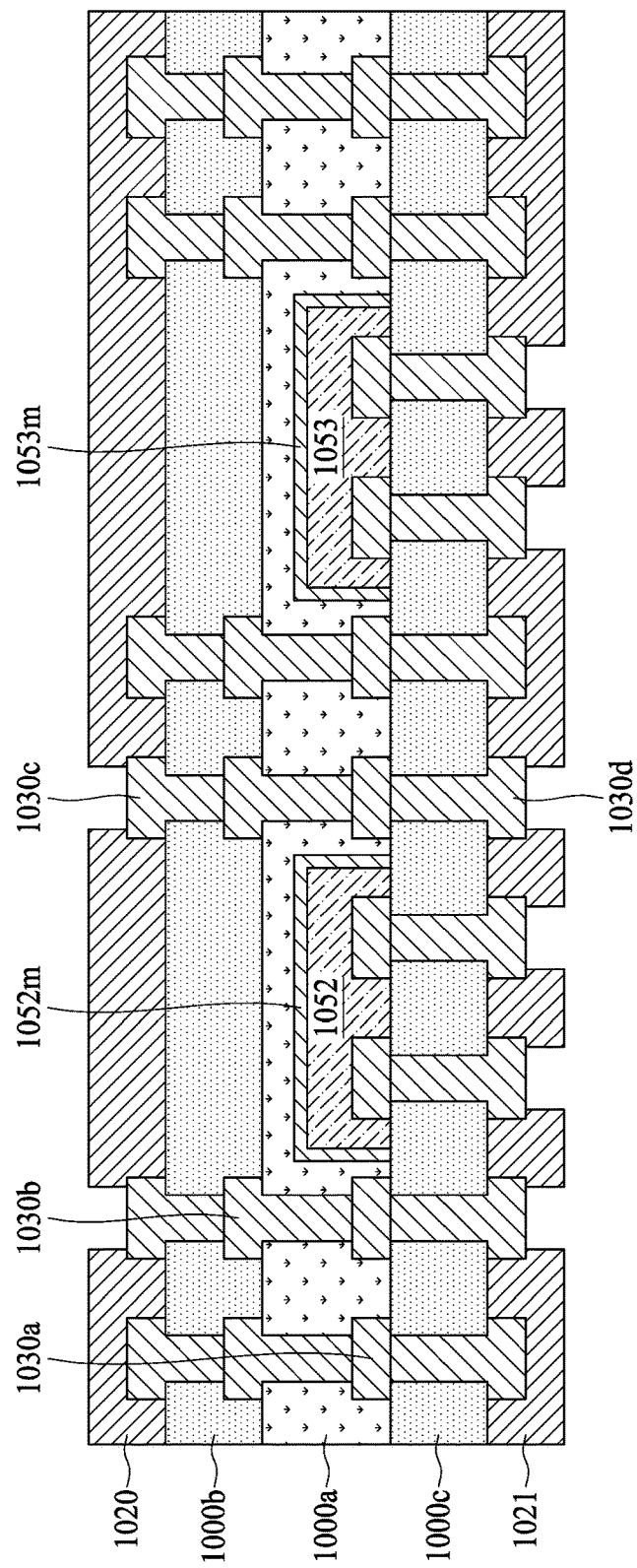

Referring to FIG. 10D, a dielectric layer 1000b is formed on a top surface of the dielectric layer 1000a to cover the patterned conductive layer 1030b. A dielectric layer 1000c is formed on a bottom surface of the dielectric layer 1000a. The dielectric layers 1000b, 1000c may be formed by laminating a dielectric material to the dielectric layer 1000a, for example. The dielectric layers 1000b, 1000c may include a material such as PP, BT, epoxy, PI, or another dielectric material. The dielectric layers 1000b, 1000c may have a thickness from approximately 5 μm to approximately 30 μm.

A patterned conductive layer 1030c is formed on the dielectric layer 1000b. A patterned conductive layer 1030d is formed on the dielectric layer 1000c. The patterned conductive layers 1030c, 1030d may be formed, for example, using photo-lithography and plating technology. The patterned conductive layers 1030c, 1030d may include, but are not limited to, Cu or another metal or alloy.

A solder resist layer 1020 is formed on the dielectric layer 1000b. The solder resist layer 1020 covers the dielectric layer 1000b and exposes the patterned conductive layer 1030c. A solder resist layer 1021 is formed on the dielectric layer 1000c. The solder resist layer 1021 covers the dielectric layer 1000c and exposes the patterned conductive layer 1030d.

Figure 10E:
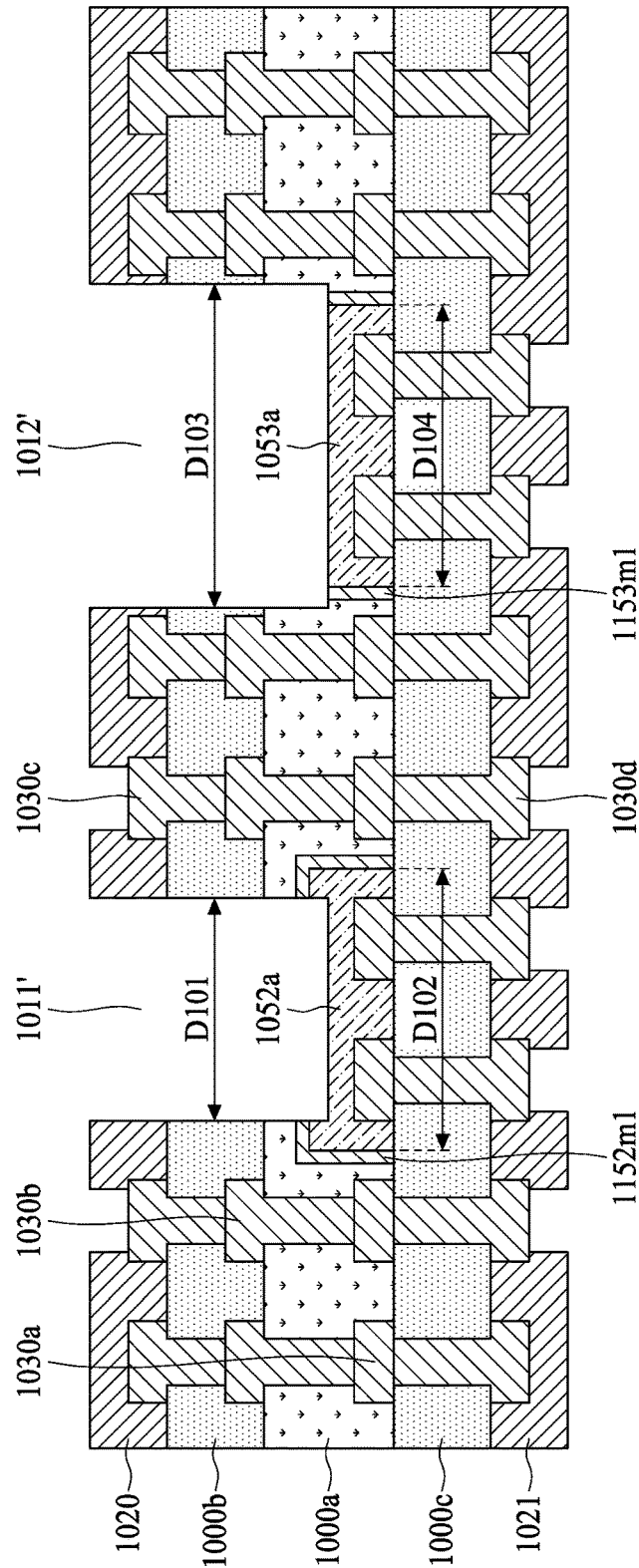

Referring to FIG. 10E, cavities 1011' and 1012' are formed. The cavity 1011' is formed by removing a portion of the solder resist layer 1020, a portion of the dielectric layers 1000a, 1000b, a portion of the metal layer 1052m and a portion of the sacrificial layer 1052, with a remaining portion 1052m1 of the metal layer 1052m and a remaining portion 1052a of the sacrificial layer 1052. In some embodiments, the solder resist layer 1020, the dielectric layers 1000a, 1000b, the metal layer 1052m and the sacrificial layer 1052 can be removed by a mechanical drilling process. A width D101 of the cavity 1011' formed by mechanical drilling is less than a width D102 of the remaining sacrificial layer 1052a. In other embodiments, the width of the cavity 1011' formed by the mechanical drilling can be greater than the width of the remaining sacrificial layer 1052a.

The cavity 1012' is formed by removing a portion of the solder resist layer 1020, a portion of the dielectric layers 1000a, 1000b, a portion of the metal layer 1053m and a portion of the sacrificial layer 1053, with a remaining portion 1053m1 of the metal layer 1053m and a remaining portion 1053a of the sacrificial layer 1053. In some embodiments, the solder resist layer 1020, the dielectric layers 1000a, 1000b, the metal layer 1053m and the sacrificial layer 1053 can be removed by a mechanical drilling process. A width D103 of the cavity 1012' formed by mechanical drilling is greater than a width D104 of the remaining sacrificial layer 1053a. In other embodiments, the width of the cavity 1012' formed by the mechanical drilling can be less than the width of the remaining sacrificial layer 1053a.

Figure 10F:
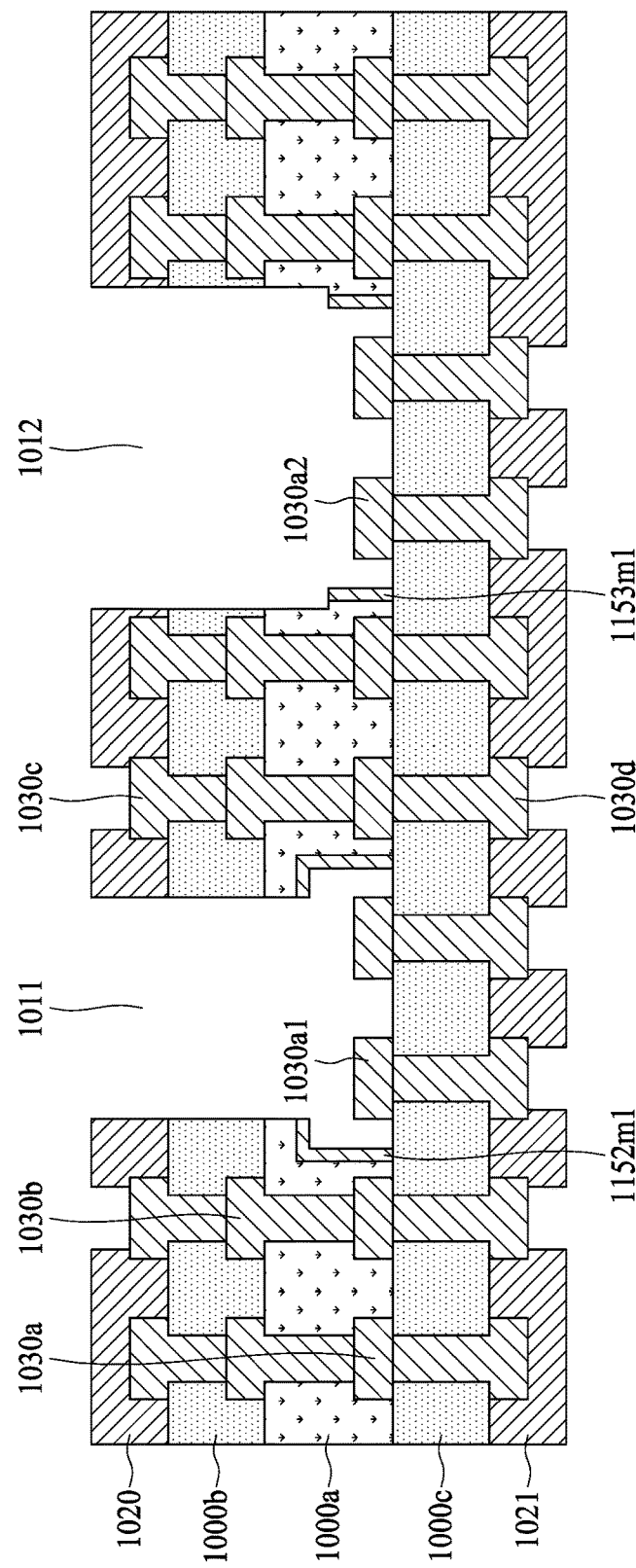

Referring to FIG. 10F, the remaining sacrificial layers 1052a, 1053a are removed to form cavities 1011, 1012, respectively. In some embodiments, the remaining sacrificial layers 1052a, 1053a can be removed by chemical etching. A portion 1030a1 of the patterned conductive layer 1030a is exposed after the sacrificial layer 1052a is removed. A portion 1030a2 of the patterned conductive layer 1030a is exposed after the sacrificial layer 1053a is removed.

Figure 10G:
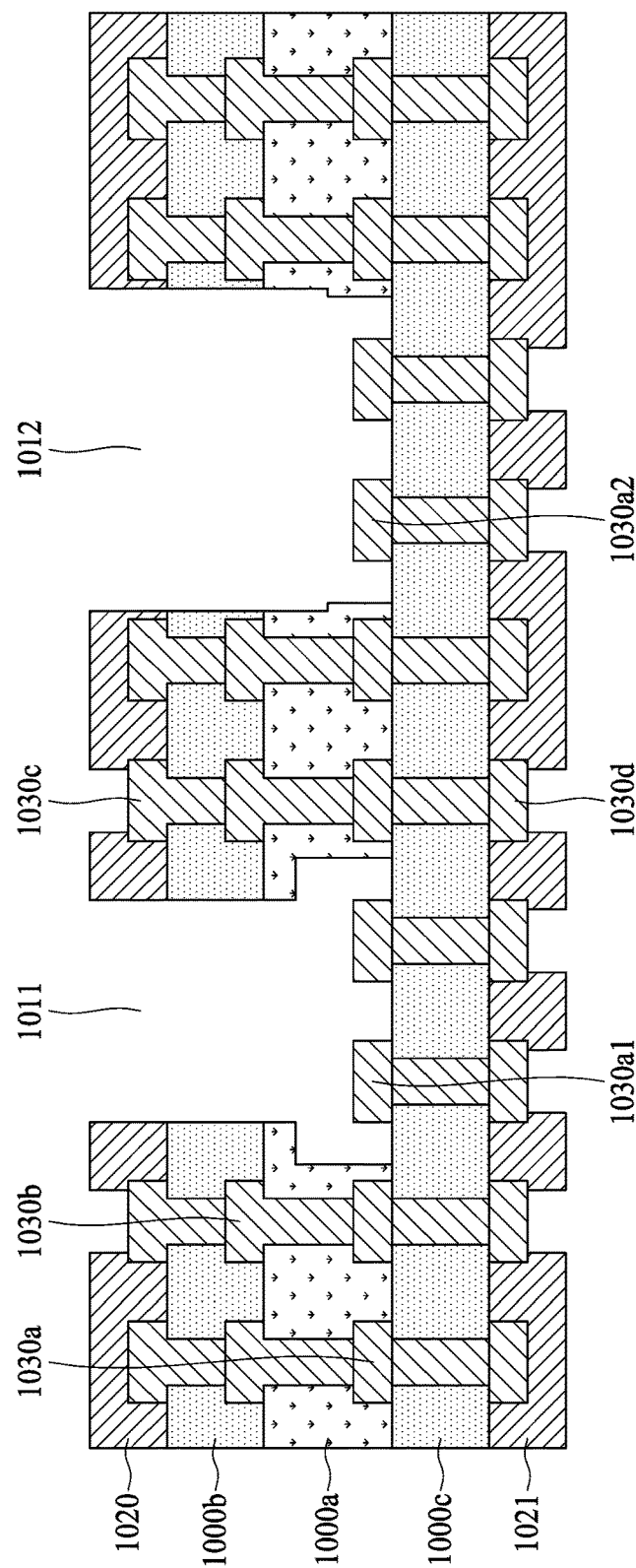

Referring to FIG. 10G, the remaining metal layers 1052m1, 1053m1 are removed. In some embodiments, the remaining metal layers 1052m1, 1053m1 are removed by etching. In some embodiments, the remaining metal layers 1052m1, 1053m1 can remain to act as shielding layers for electronic components to be accommodated in the cavities 1011, 1012.

FIGS. 11A-11D illustrate a semiconductor manufacturing method in accordance with some embodiments of the present disclosure.

Figure 11A:
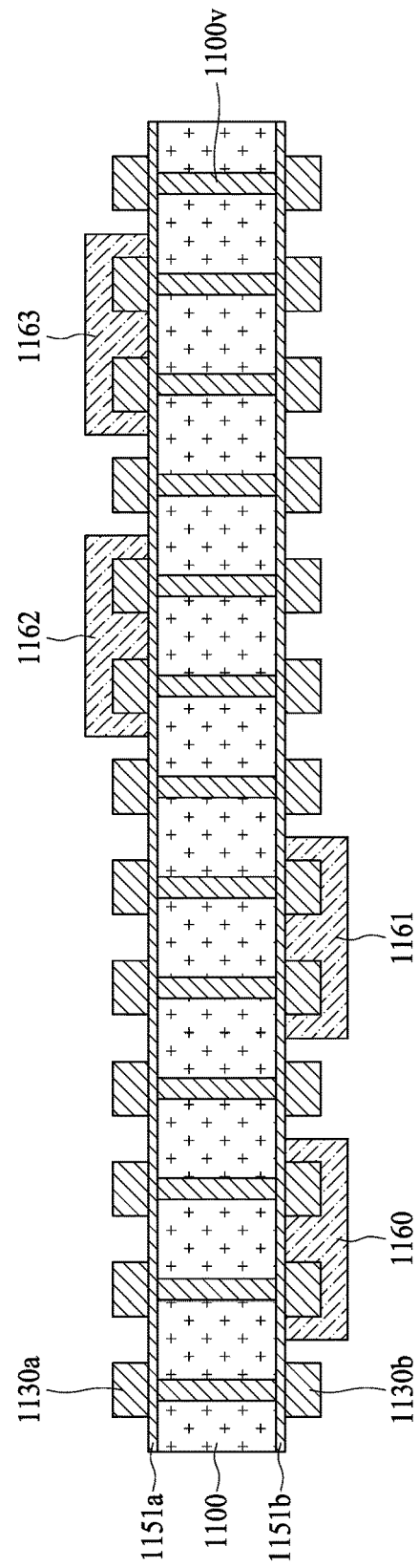
FIG. 11A, FIG. 11B, FIG. 11C, and FIG. 11D illustrate a manufacturing method in accordance with some embodiments of the present disclosure.

Referring to FIG. 11A, a core structure 1100 is provided. The core structure 1100 may be, for example, a silicon substrate, a plastic substrate or a ceramic substrate.

Metal layers 1151a, 1151b are respectively formed on a top surface and a bottom surface of the core structure 1100. The metal layers 1151a, 1151b may be a thin sheet. In some embodiments, the metal layers 1151a, 1151b have a thickness of approximately 2 μm. In some embodiments, the metal layers 1151a, 1151b include Cu, Pt or another conductive material.

A patterned conductive layer 1130a is formed on the metal layer 1151a. A patterned conductive layer 1130b is formed on the metal layer 1151b. The patterned conductive layers 1130a, 1130b may be formed, for example, using photo-lithography and plating technology. In some embodiments, the patterned conductive layers 1130a, 1130b are relatively flat and smooth patterned conductive layers. The patterned conductive layers 1130a, 1130b may include, but are not limited to, Cu or another metal or alloy.

A plurality of through vias 1100v are formed to penetrate the core structure 1100 to electrically connect the patterned conductive layer 1130a with the patterned conductive layer 1130b. The through vias 1100v can be formed by the stages shown in FIGS. 8A-8C or other suitable processes.

Sacrificial layers 1160, 1161 are formed on a portion of the metal layer 1151b and cover a portion of the conductive layer 1130b. Sacrificial layers 1162, 1163 are formed on a portion of the metal layer 1151a and cover a portion of the conductive layer 1130a. The sacrificial layers 1160, 1161, 1162, 1163 may be a dry film or may be formed of a coating film, peelable adhesive or other suitable materials.

Figure 11B:
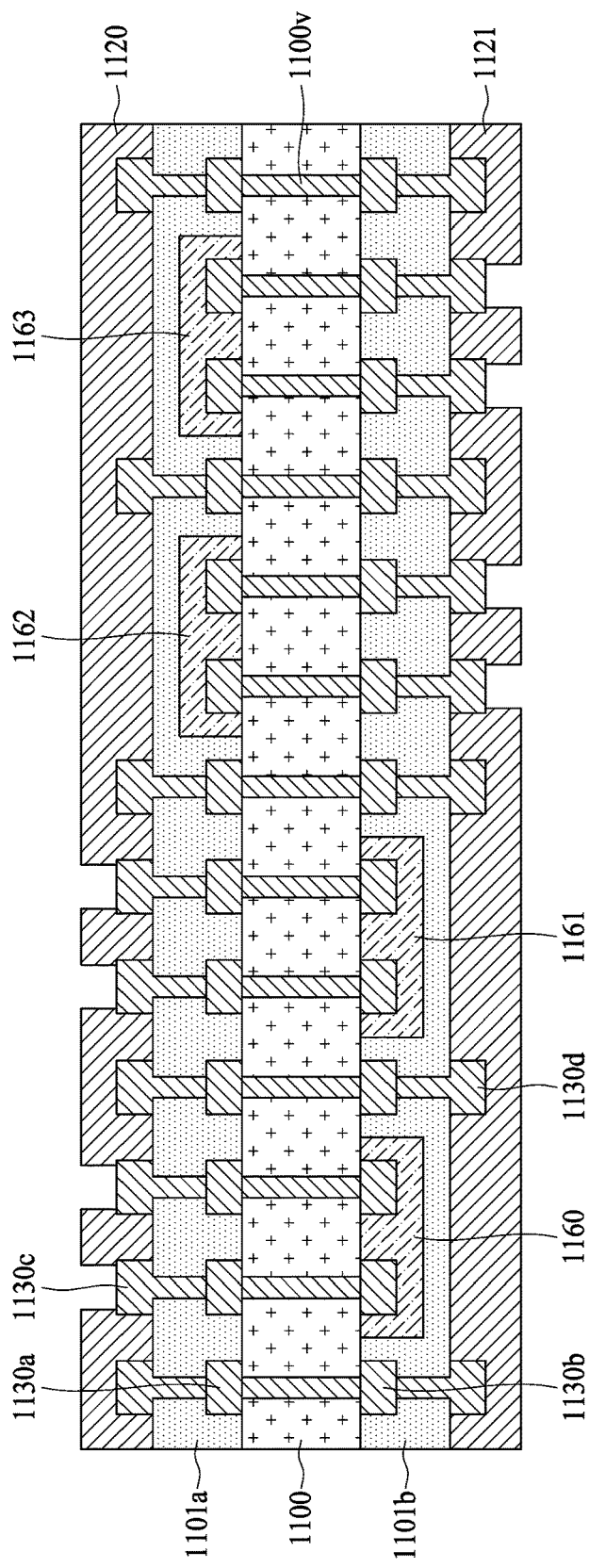

Referring to FIG. 11B, exposed portions of the metal layers 1151a, 1151b are removed by, for example, etching. Dielectric layers 1101a, 1101b are then respectively formed on the top surface and the bottom surface of the core structure 1100 to cover the conductive layers 1130a, 1130b and sacrificial layers 1160, 1161, 1162, 1163. The dielectric layers 1101a, 1101b may be formed by laminating a dielectric adhesive material to the core structure 1100, for example. The dielectric layers 1101a, 1101b may include a material such as PP, BT, epoxy, PI, or another dielectric material. The dielectric layers 1101a, 1101b may have a thickness from approximately 5 μm to approximately 30 μm. In some embodiments, the dielectric layers 1101a, 1101b can be formed by a MSAP. In other embodiments, the dielectric layers 1101a, 1101b can be formed by EPP or a SAP.

A patterned conductive layer 1130c is formed on the dielectric layer 1101a. A patterned conductive layer 1130d is formed on the dielectric layer 1101b. The patterned conductive layers 1130c, 1130d may be formed, for example, using photo-lithography and plating technology. In some embodiments, the patterned conductive layers 1130c, 1130d are relatively flat and smooth patterned conductive layers. The patterned conductive layers 1130c, 1130d may include, but are not limited to, Cu or another metal or alloy.

A solder resist layer 1120 is formed on the dielectric layer 1101a. The solder resist layer 1120 covers the dielectric layer 1101a and exposes the patterned conductive layer 1130c. A solder resist layer 1121 is formed on the dielectric layer 1101b. The solder resist layer 1121 covers the dielectric layer 1101b and exposes the patterned conductive layer 1130d.

Figure 11C:
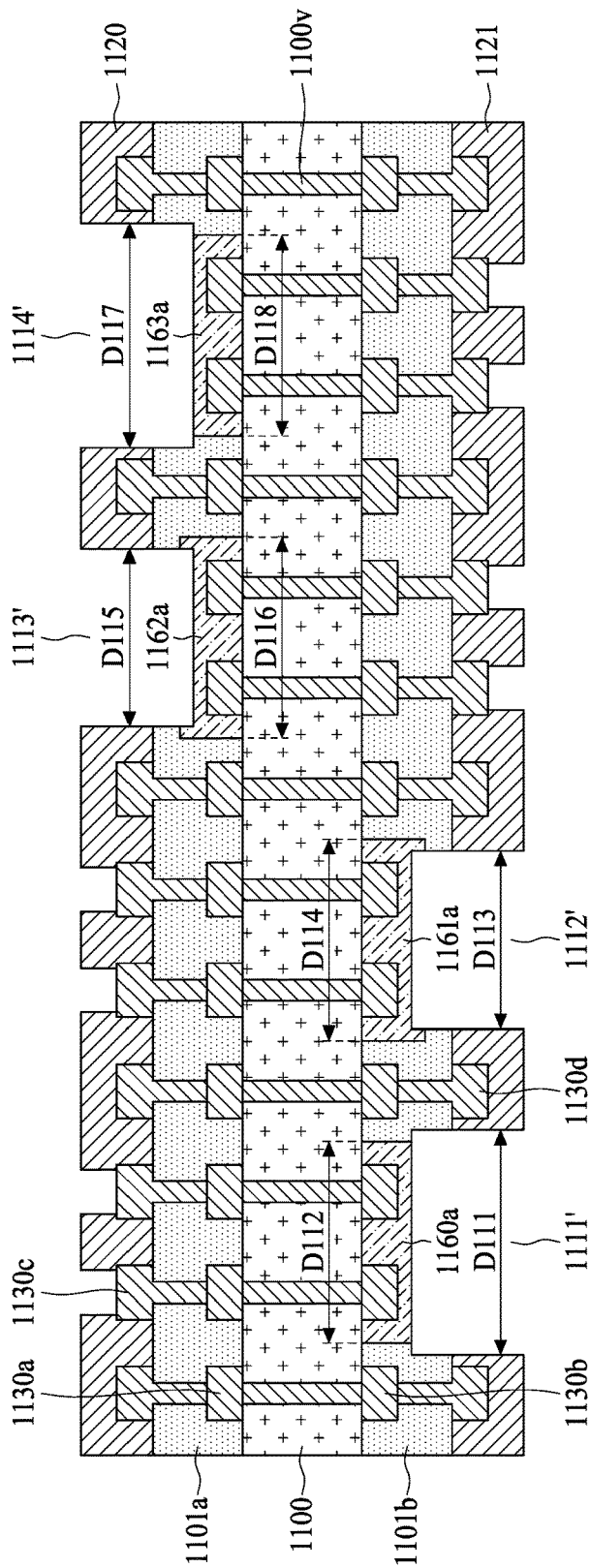

Referring to FIG. 11C, cavities 1111', 1112', 1113' and 1114' are formed. The cavity 1111' is formed by removing a portion of the solder resist layer 1121, a portion of the dielectric layer 1101b and a portion of the sacrificial layer 1160, with a remaining portion 1160a of the sacrificial layer 1160. In some embodiments, the solder resist layer 1121, the dielectric layer 1101b and the sacrificial layer 1160 can be removed by a mechanical drilling process. A width D111 of the cavity 1111' formed by mechanical drilling is greater than a width D112 of the remaining sacrificial layer 1160a. In other embodiments, the width of the cavity 1111' formed by the mechanical drilling may be less than the width of the remaining sacrificial layer 1160a.

The cavity 1112' is formed by removing a portion of the solder resist layer 1121, a portion of the dielectric layer 1101b and a portion of the sacrificial layer 1161, with a remaining portion 1161a of the sacrificial layer 1161. In some embodiments, the solder resist layer 1121, the dielectric layer 1101b and the sacrificial layer 1161 can be removed by a mechanical drilling process. A width D113 of the cavity 1112' formed by mechanical drilling is less than a width D114 of the remaining sacrificial layer 1161a. In other embodiments, the width of the cavity 1112' formed by the mechanical drilling may be greater than the width of the remaining sacrificial layer 1161a.

The cavity 1113' is formed by removing a portion of the solder resist layer 1120, a portion of the dielectric layer 1101a and a portion of the sacrificial layer 1162, with a remaining portion 1162a of the sacrificial layer 1162. In some embodiments, the solder resist layer 1120, the dielectric layer 1101a and the sacrificial layer 1162 can be removed by a mechanical drilling process. A width D115 of the cavity 1113' formed by mechanical drilling is less than a width D116 of the remaining sacrificial layer 1162a. In other embodiments, the width of the cavity 1113' formed by the mechanical drilling may be greater than the width of the remaining sacrificial layer 1162a.

The cavity 1114' is formed by removing a portion of the solder resist layer 1120, a portion of the dielectric layer 1101a and a portion of the sacrificial layer 1163, with a remaining portion 1163a of the sacrificial layer 1163. In some embodiments, the solder resist layer 1120, the dielectric layer 1101a and the sacrificial layer 1163 can be removed by a mechanical drilling process. A width D117 of the cavity 1114' formed by mechanical drilling is greater than a width D118 of the remaining sacrificial layer 1163a. In other embodiments, the width of the cavity 1114' formed by the mechanical drilling may be less than the width of the remaining sacrificial layer 1163a.

Figure 11D:
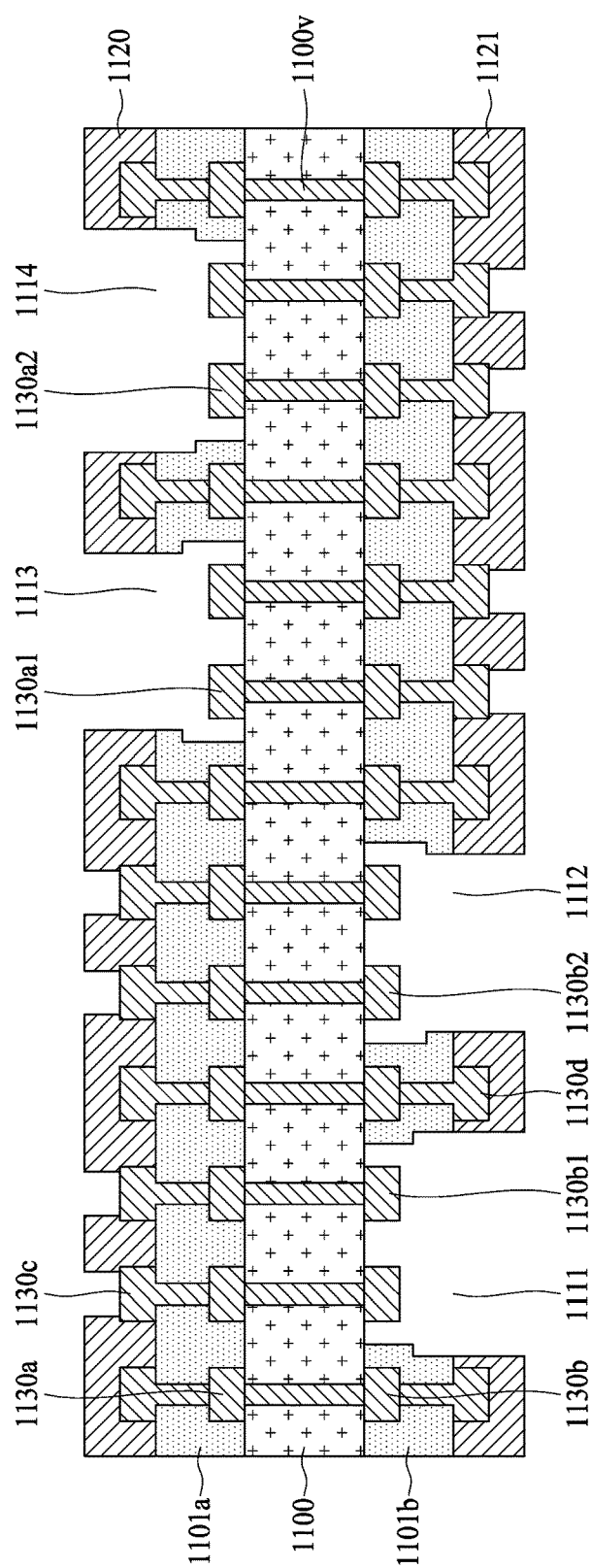

Referring to FIG. 11D, the remaining sacrificial layers 1160a, 1161a, 1162a, 1163a are removed to respectively form cavities 1111, 1112, 1113, 1114. In some embodiments, the sacrificial layers 1160a, 1161a, 1162a, 1163a can be removed by chemical etching. After removing the sacrificial layers 1160a, 1161a, 1162a, 1163a, portions 1130b1, 1130b2, 1130a1, 1130a2 of the conductive layers 1130b, 1130a are exposed.

As shown in FIG. 11D, the cavities 1111, 1114 of a resulting semiconductor substrate are ladder-like if the mechanical drilling width is greater than the width of the sacrificial layer (the cavities 1111' and 1114' shown in FIG. 11C). The cavities 1112, 1113 of the semiconductor substrate are ledge-like if the mechanical drilling width is less than the width of the sacrificial layer (the cavities 1112' and 1113' shown in FIG. 11C). Therefore, the shape of the cavities 1111, 1112, 1113, 1114 can be controlled by adjusting a range of the mechanical drilling.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers (μm) of lying along a same plane, such as within 10 μm, within 5 μm, within 4 μm, within 3 μm, within 2 μm, within 1 μm, or within 0.5 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component. In the description of some embodiments, a component provided "under" another component can encompass cases where the former component is directly below (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor substrate, comprising:
   an interconnection structure;
   a first dielectric layer surrounding the interconnection structure, the first dielectric layer having a first surface; and
   a second dielectric layer disposed on the first dielectric layer, the second dielectric layer having a first sidewall and a second sidewall;
   wherein the first sidewall and the second sidewall of the second dielectric layer and the first surface of the first dielectric layer define a first cavity; and
   wherein the first sidewall of the second dielectric layer is laterally displaced from the second sidewall of the second dielectric layer.

2. The semiconductor substrate according to claim 1, wherein a width of the first sidewall is different from a width of the second sidewall.

3. The semiconductor substrate according to claim 1, wherein a portion of the interconnection structure is on the first surface of the first dielectric layer which defines the first cavity.

4. The semiconductor substrate according to claim 3, wherein a thickness of the first dielectric layer is greater than a height of the portion of the interconnection structure on the first surface of the first dielectric layer.

5. The semiconductor substrate according to claim 1, wherein a portion of the interconnection structure is below the first surface of the first dielectric layer which defines the first cavity, and the portion of the interconnection structure is exposed from an opening of the first surface of the first dielectric layer.

6. The semiconductor substrate according to claim 1, wherein a top surface of a portion of the interconnection structure and the first surface of the first dielectric layer are substantially coplanar.

7. The semiconductor substrate according to claim 1, wherein the second dielectric layer further defines a second cavity, the second cavity is defined by a third sidewall and a fourth sidewall of the second dielectric layer and a second surface of the first dielectric layer, and the first surface of the first dielectric layer and the second surface of the first dielectric layer are vertically displaced from one another.

8. The semiconductor substrate according to claim 1, wherein the second dielectric layer further defines a second cavity, the second cavity is defined by a third sidewall and a fourth sidewall of the second dielectric layer and a second surface of the first dielectric layer, and the first surface of the first dielectric layer and the second surface of the first dielectric layer are substantially coplanar.

9. The semiconductor substrate according to claim 1, further comprising a conductive layer disposed on the first sidewall and the second sidewall of the second dielectric layer.

10. The semiconductor substrate according to claim 1, wherein the second dielectric layer further defines a second cavity, the second cavity defined by a third sidewall and a fourth sidewall of the second dielectric layer, an opening of the first cavity is opposite to an opening of the second cavity, and the third sidewall is laterally displaced from the fourth sidewall.

11. The semiconductor substrate according to claim 1, wherein the first cavity is sized to accommodate at least one electronic component.

12. A substrate, comprising:
    an interconnection structure;
    a first dielectric layer surrounding the interconnection structure, the first dielectric layer having a first surface; and
    a second dielectric layer disposed on the first dielectric layer, the second dielectric layer having a first sidewall and a second sidewall;
    wherein the first sidewall of the second dielectric layer defines a first cavity and the second sidewall of the second dielectric layer and the first surface of the first dielectric layer define a second cavity under the first cavity, the first cavity and the second cavity expose a portion of the interconnection structure, and a width of the first cavity is different from a width of the second cavity.

13. The substrate according to claim 12, wherein the first sidewall defining the first cavity and the second sidewall defining the second cavity are discontinuous.

14. The substrate according to claim 12, wherein the portion of the interconnection structure is on the first surface of the first dielectric layer.

15. The substrate according to claim 14, wherein a thickness of the second dielectric layer is greater than a depth of the second cavity.

16. The substrate according to claim 15, wherein the depth of the second cavity is greater than a height of the portion of the interconnection structure on the first surface of the first dielectric layer.

17. The substrate according to claim 12, wherein the portion of the interconnection structure is under the first surface of the first dielectric layer.

18. The substrate according to claim 12, wherein a top surface of the portion of the interconnection structure and the first surface of the first dielectric layer are substantially coplanar.

19. The substrate according to claim 12, further comprising a conductive layer disposed on the first sidewall defining the first cavity and the second sidewall defining the second cavity.

20. The substrate according to claim 12, wherein the first cavity and the second cavity are sized to accommodate at least one electronic component.

21. A substrate, comprising:
a core structure having a top surface and a bottom surface opposite to the top surface;
a first conductive layer on the top surface of the core structure;
a second conductive layer on the bottom surface of the core structure;
a first dielectric layer on the top surface of the core structure; and
a second dielectric layer on the bottom surface of the core structure,
wherein the first dielectric layer has a first sidewall and a second sidewall, the first sidewall of the first dielectric layer defines a first cavity, the second sidewall of the first dielectric layer and the top surface of the core structure define a second cavity, and the first sidewall is laterally displaced from the second sidewall.

22. The substrate according to claim 21, wherein a width of the first sidewall is greater than a width of the second sidewall.

23. The substrate according to claim 21, wherein a width of the first sidewall is less than a width of the second sidewall.

24. The substrate according to claim 21, wherein the first dielectric layer, the core structure, and the second dielectric layer define a third cavity extending from a top surface of the first dielectric layer through the core structure toward the second dielectric layer to expose a portion of the second conductive layer, the third cavity is further defined by a third sidewall of the first dielectric layer, a fourth sidewall of the core structure and a fifth sidewall of the core structure, the third sidewall of the first dielectric layer is substantially coplanar with the fourth sidewall of the core structure, and the fourth sidewall of the core structure is laterally displaced from the fifth sidewall of the core structure.

25. The substrate according to claim 24, wherein a width of the fourth sidewall of the core structure is greater than a width of the fifth sidewall of the core structure.

26. The substrate according to claim 24, wherein a width of the fourth sidewall of the core structure is less than a width of the fifth sidewall of the core structure.

27. The substrate according to claim 21, further comprising a conductive layer disposed on the first sidewall and the second sidewall of the first dielectric layer.

* * * * *